(12) United States Patent
Dordi et al.

(10) Patent No.: US 6,613,214 B2
(45) Date of Patent: Sep. 2, 2003

(54) ELECTRIC CONTACT ELEMENT FOR ELECTROCHEMICAL DEPOSITION SYSTEM AND METHOD

(75) Inventors: Yezdi N. Dordi, Palo Alto, CA (US); Joseph J. Stevens, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 96 days.

(21) Appl. No.: 09/730,968

(22) Filed: Dec. 5, 2000

(65) Prior Publication Data

US 2001/0000396 A1 Apr. 26, 2001

Related U.S. Application Data

(63) Continuation-in-part of application No. 09/289,074, filed on Apr. 8, 1999, now Pat. No. 6,258,220, which is a continuation-in-part of application No. 09/201,486, filed on Nov. 30, 1998, now Pat. No. 6,251,236.

(51) Int. Cl.[7] .................... C25D 5/02; C25D 5/00; C25D 17/00

(52) U.S. Cl. .................. 205/118; 205/137; 204/212; 204/224 R; 204/297.01

(58) Field of Search ................. 204/297.01, 212, 204/224 R; 205/118, 137

(56) References Cited

U.S. PATENT DOCUMENTS

| | | | |
|---|---|---|---|
| 4,364,816 A | 12/1982 | Birt | 204/297 W |
| 4,428,815 A | 1/1984 | Powell et al. | 204/297 W |
| 4,435,266 A | 3/1984 | Johnston | 204/276 |

(List continued on next page.)

FOREIGN PATENT DOCUMENTS

| | | | |
|---|---|---|---|
| JP | 58-182823 | 10/1983 | H01L/21/288 |
| JP | 60-172291 | 9/1985 | C12P/7/52 |
| JP | 04-131395 | 5/1992 | C25D/5/34 |
| JP | 04-280993 | 10/1992 | C25D/5/18 |
| JP | 63-118093 | 5/1999 | C25D/5/18 |
| WO | 97/12079 | 4/1997 | C25D/5/02 |
| WO | 99/25904 | 5/1999 | C25D/5/02 |
| WO | 99/25905 | 5/1999 | C25D/5/02 |

OTHER PUBLICATIONS

K. Pitney, Ney Contact Manual, J.M. Ney Co. (1973) (No Month).

Peter Singer, "Tantalum, Cooper amd Damascene: The Future of Interconnects," Semiconductor International, Jun. 1998, pp. cover, 91–92, 94, 96 & 98.

(List continued on next page.)

Primary Examiner—Donald R. Valentine
(74) Attorney, Agent, or Firm—Moser, Patterson & Sheridan

(57) ABSTRACT

An apparatus and associated method for deposition of metal ions contained in an electrolyte solution to form a metal film primarily on a seed layer formed on at least a first side of a substrate. The substrate has a second side that is opposed the first side and an edge joining the first side and the second side. The apparatus comprises a substrate holder system and an electric contact element. The electric contact element physically contacts one of the second side or the edge of the substrate. In one aspect, the substrate is rotated about its vertical axis when the seed layer of substrate is immersed in the electrolyte solution during the metal film deposition. In another aspect, the substrate is not rotated about its vertical axis when the seed layer on the substrate is immersed in the electrolyte solution during the metal film deposition. In different embodiments, the electric contact element contacts the seed layer on the second side of the substrate, a diffusion barrier layer on the second side of the substrate, or the seed layer on the edge of the substrate.

38 Claims, 12 Drawing Sheets

U.S. PATENT DOCUMENTS

| | | | | |
|---|---|---|---|---|
| 5,222,310 A | | 6/1993 | Thompson et al. | 34/202 |
| 5,224,504 A | | 7/1993 | Thompson et al. | 134/155 |
| 5,227,041 A | * | 7/1993 | Brogden et al. | 204/279 R |
| 5,230,743 A | | 7/1993 | Thompson et al. | 134/32 |
| 5,377,708 A | | 1/1995 | Bergman et al. | 134/105 |
| 5,429,733 A | | 7/1995 | Ishida | 204/224 R |
| 5,447,615 A | | 9/1995 | Ishida | 204/224 |
| 5,620,581 A | | 4/1997 | Ang | 205/96 |
| 5,807,469 A | | 9/1998 | Crafts et al. | 204/297 W |
| 5,833,820 A | * | 11/1998 | Dubin | 204/212 |
| 5,997,701 A | | 12/1999 | Bock | 204/205 |
| 6,071,388 A | | 6/2000 | Uzoh | 204/297 R |
| 6,080,291 A | | 6/2000 | Woodruff et al. | 204/297.01 |
| 6,217,734 B1 | * | 4/2001 | Uzoh | 205/118 |
| 6,322,678 B1 | | 11/2001 | Woodruff et al. | 204/297.08 |

OTHER PUBLICATIONS

Peter Singer, "Wafer Processing," Semiconductor International, Jun. 1998, p. 70.

Kenneth E. Pitney, "NEY Contact Manual," Electrical Contacts for Low Energy Uses, 1973 (No Month).

* cited by examiner

ELECTRIC CONTACT ELEMENT FOR ELECTROCHEMICAL DEPOSITION SYSTEM AND METHOD

This is a continuation-in-part of prior U.S. patent application Ser. No. 09/201,486, filed Nov. 30, 1998, now U.S. Pat. No. 6,251,236, and entitled "CATHODE CLAMP RING FOR ELECTROCHEMICAL DEPOSITION."

This is also a continuation-in-part of prior filed U.S. patent application Ser. No. 09/289,074, filed Apr. 8, 1999, now U.S. Pat. No. 6,258,220 and entitled "ELECTROCHEMICAL DEPOSITION SYSTEM."

BACKGROUND OF THE INVENTION

1. Field of the Invention

The present invention generally relates to deposition of metal film onto a seed layer deposited on a substrate. More particularly, the present invention relates to the structure and operation of electric contact elements used to apply electricity to a substrate during metal film deposition on a seed layer on a substrate.

2. Background of the Related Art

Electroplating is used for the fabrication of lines and to form interconnect features, e.g. vias, trenches, and electric contacts. One embodiment of a feature-filling process including electroplating involves initially depositing a diffusion barrier layer upon the substrate by a process such as physical vapor deposition (PVD), chemical vapor deposition (CVD), or electroless deposition. A seed layer is then deposited over the diffusion barrier layer on the substrate by a process such as PVD, CVD, or electroless deposition. A metal film is electroplated on the seed layer on a substrate. The deposited metal film is planarized by a process such as chemical mechanical polishing (CMP) to define conductive interconnect features. Metal film deposition by electroplating is accomplished by establishing a voltage/current level between the substrate seed layer and an anode.

FIG. 1 shows a cross sectional view of a typical electrochemical deposition (ECD) system 10. Generally, the ECD system 10 includes a electrolyte cell 12, a substrate holder system 14 disposed above the electrolyte cell 12, an anode 16, and an electric contact ring 152. A plurality of grooves 24 are formed in the lower surface of the substrate holder system 14. A vacuum generator 25 fluidly communicates with the grooves 24 to create a vacuum capable of retaining the substrate 22 to the substrate holder system 14 during processing.

FIG. 2 shows a generally cylindrical electric contact ring 152 that contains a plurality of embedded metal or metal alloy electric contacts elements 56. Each electric contact elements 56 extends radially inwardly from the electric contact ring and physically contacts a part of the conductive seed layer on the substrate 22. The electric contact elements 56 may include electric contact pins, electric contact rods, electric contact surfaces, electric contact pads, or any other known types of electric contact elements. A controller 222 interacts with a power supply to control the application of electric currents/that flow via electrolyte solution contained in the electrolyte cell 12, from the electric contact elements 56 and the seed layer on the substrate and the electric voltage between the anodes and the seed layer.

There are a variety of factors relating to electric contact elements that can affect current density uniformity across the seed layer on the substrate and the uniformity of metal film deposition rate across the substrate seed layer. Because the electric contact ring is exposed to the electrolyte solution, conductive portions of the electric contact ring 152 that contact the electrolyte solution, such as the electric contact elements 56, accumulate metal film deposits during electroplating. The metal film deposits on each electric contact element may form geometrically different electric contact elements 56, and each electric contact/deposit combination may apply a unique current density to the substrate seed layer. Differing current densities powered by the electric contact elements having different electrical properties resulting from their varying geometric form result in a non-uniform current density distribution across the substrate seed layer during plating. Additionally, in inconsistent metal film deposition on the substrate seed layer produces variations in the metal film deposition between different substrates.

Furthermore, the electric current density applied to the plating surface of the substrate tends to decrease as the distance increases from the electric contact elements. The non-uniform current density across the substrate seed layer result in variations of deposition rates across the seed layer. A fringing effect also occurs at the edge of the substrate due to the localized electric field emitted by the electric contact elements where electric contact elements 56 contact the seed layer. The fringing effect causes a higher deposition rate on the seed layers near the edge of the substrate, which also contribute to non-uniform metal film deposition results.

It is difficult to effectively seal between the substrate and the electric contact ring 152 as a result of the shape of the electric contact elements that extends between the substrate and the electric contact ring. Because the electric contact elements 56 only contact a small portion of the substrate seed layer area, a space is created between each pair of adjacent electric contact elements, the electric contact ring 152, and the substrate 22 often allows some electrolyte solution to fluidly flow to the backside of the substrate, and thereby deposit metal films thereon. The metal film deposition on the backside or edge of a substrate that forms as a result of the electrolyte solution flowing to the substrate backside are known as "backside deposits". The backside deposits may bond the substrate to the electric contact elements 56 during processing. Breaking the backside deposits that adhere the substrate to the electric contact elements require application of force to the substrate that may bend or damage the substrate. Breaking the backside deposits may also cause problem related to broken deposited metal film material. For example, broken deposit particles may become lodged in post-plating handling devices and contaminate subsequent system components. Scattered, broken deposits are also a source of contamination and potential damage to the substrate. The fragmented metal film deposits may generate particles that contaminate and limit the effectiveness of metal film deposition within the electrolyte solution.

Therefore, there remains a need for an ECD system in which the electric contact elements are effectively isolated from the electrolyte solution such that the formation of metal film deposits on the electric contact elements is limited. Such electric contact elements would enhance the uniformity of the electrical current density across the substrate seed layer in an electrolyte cell, and therefore facilitate a uniform deposition thickness of the metal film across the seed layer on the substrate. The electric contact elements should be positioned to allow for effective sealing against the flow of electrolyte solution around the side and backside of the substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

DETAILED DESCRIPTION OF THE PREFERRED EMBODIMENT

Multiple embodiments of an electrochemical deposition (ECD) system for deposit a metal film on a substrate seed layer are now described. The ECD system includes one or more electric contact elements that are electrically biased and physically positioned, to be able to apply an electrical bias voltage to a seed layer formed on a substrate. In one embodiment, a plurality of electric contact elements physically contact a portion of the seed layer located on the front of a substrate to apply the electric bias. In another embodiment, a plurality of electric contact elements physically contact a portion of the seed layer on the edge and/or the backside of a substrate to apply the electrical bias. In this disclosure, the terms "substrate", "wafer", or "object" are used interchangeably and include a substrate having a seed layer on which a metal film is deposited.

Figure 1:
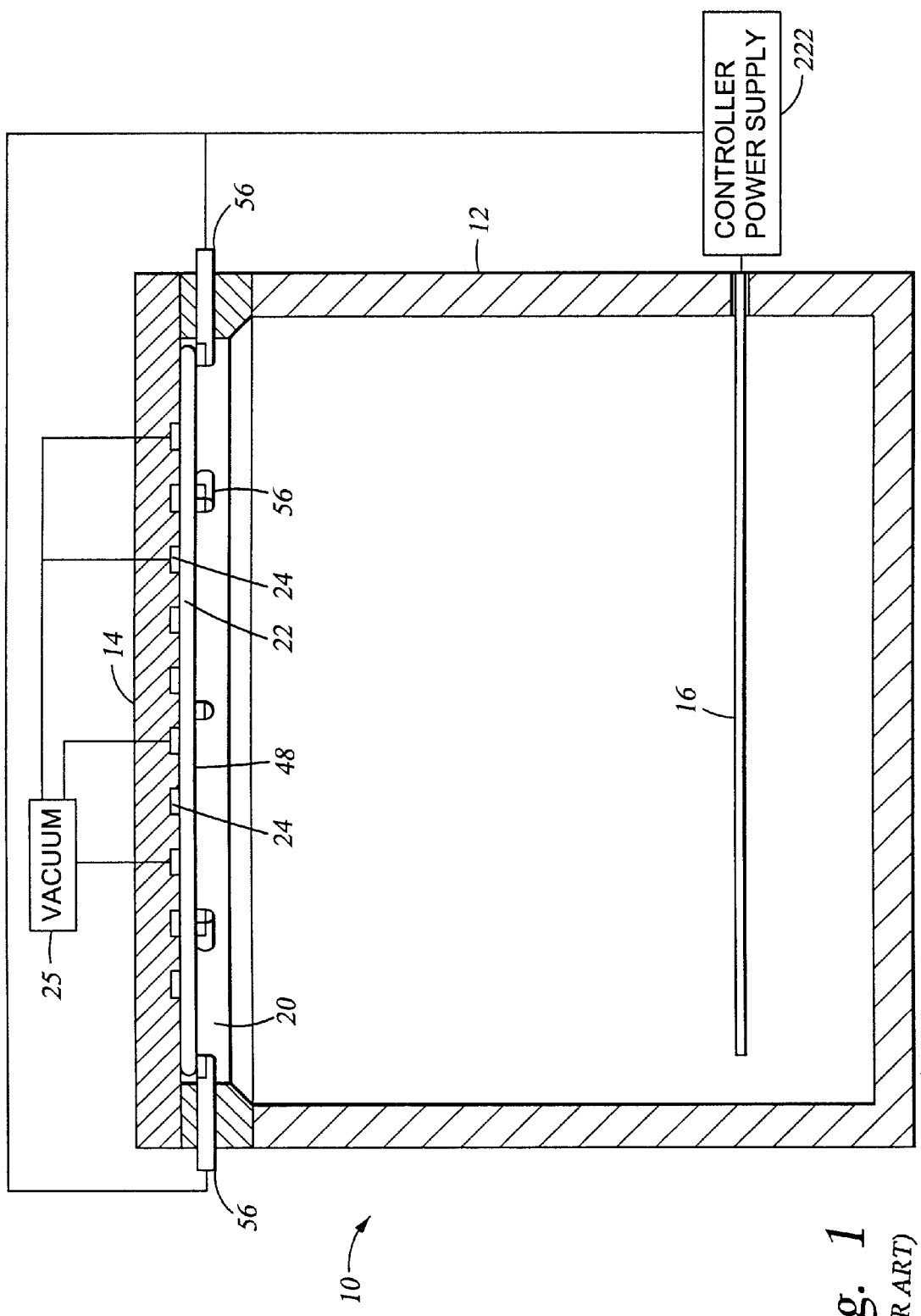
FIG. 1 is a cross sectional view of a prior art electro-chemical deposition (ECD) system.
Figure 2:
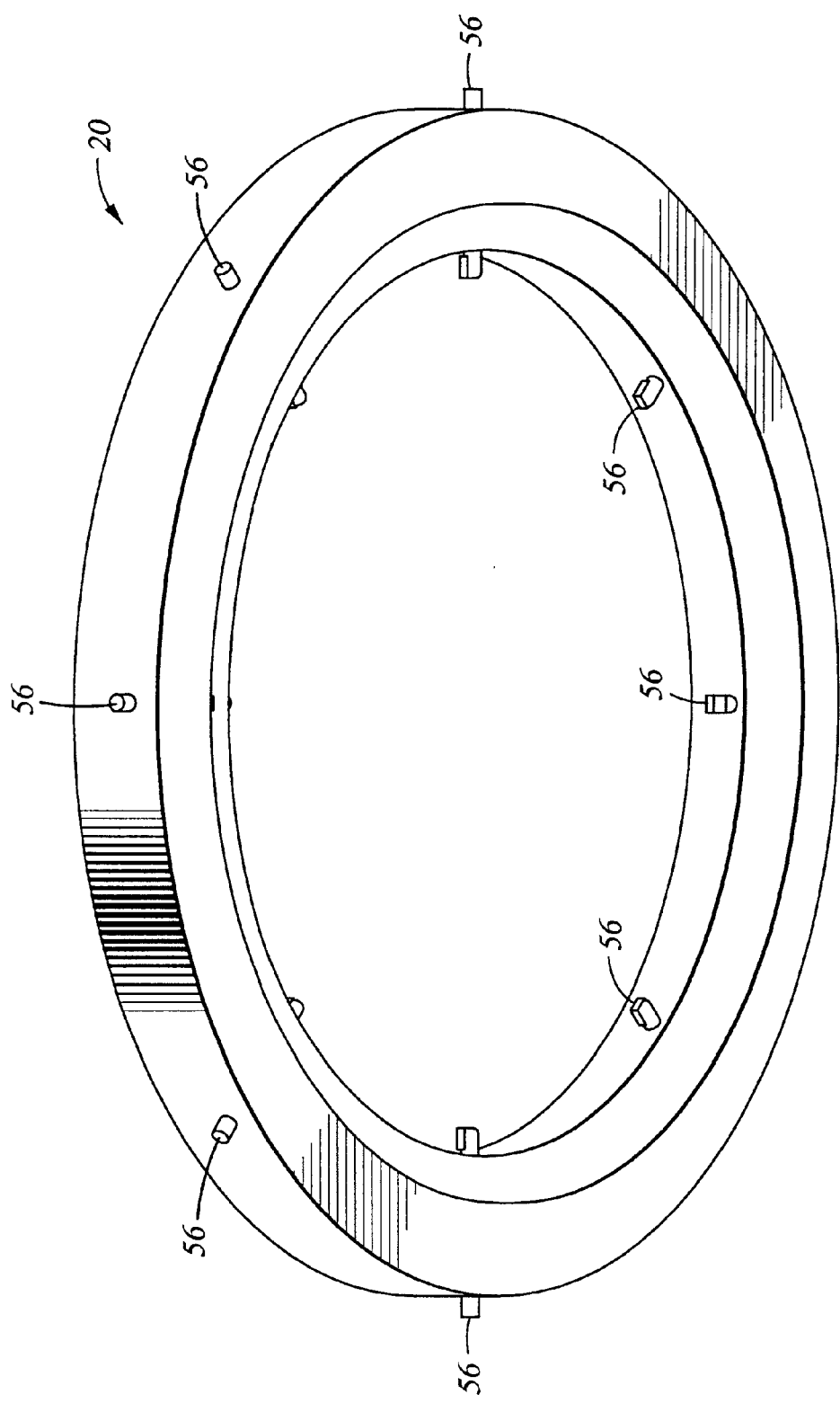
FIG. 2 is a perspective view of a prior art electric contact ring of the ECD system of FIG. 1.
Figure 3:
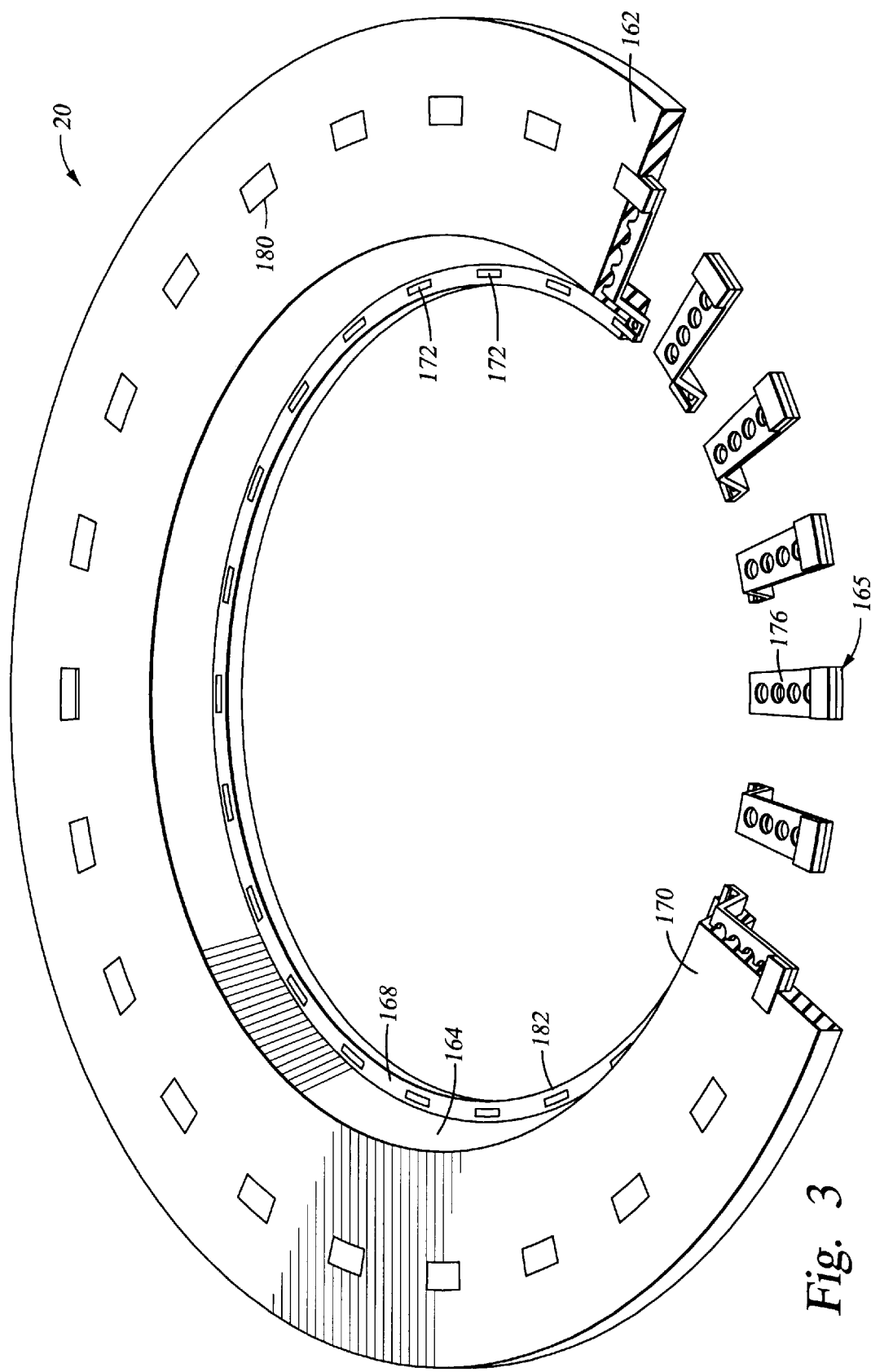
FIG. 3 is a partial cross sectional perspective view of one embodiment of an electric contact ring.

I. Electric Contact Elements that Physically Contact the Front of the Substrate FIG. 3 is a cross sectional view of one embodiment of an electric contact ring 152. In general, the electric contact ring 152 comprises an annular insulative body 170 having a plurality of electric contact elements 165 disposed therein. Electric contact elements are deposited at the point of contact between the electric contact ring 152 and the front of a substrate supported by the electric contact ring. The annular insulative body 170 is constructed of an insulating material to electrically isolate the plurality of electric contact elements except at desired locations where the electric contact elements contact the seed layer on the substrate. The substrate is positioned face down in the electric contact ring 152 during processing. An interior portion of the annular insulative body 170 and the electric contact elements 165 form a substrate seating surface that supports a substrate during processing.

The electric contact ring 152 generally comprises a plurality of electric contact elements 165 that are at least partially disposed within an annular insulative body 170. The annular insulative body 170 includes a flange 162 and a downward sloping shoulder 164 leading to a substrate seating surface 168. The substrate seating surface 168 is located below the flange 162 such that the flange 162 and the substrate seating surface 168 lie in offset and substantially parallel planes. Thus, the flange 162 may be understood to define a first plane while the substrate seating surface 168 defines a second plane parallel to the first plane wherein the shoulder 164 extends between the two planes. In another embodiment of electric contact ring, the downward sloping shoulder 164 may be of a steeper substantially vertical angle to be substantially normal to both the flange 162 and the substrate seating surface 168. Alternatively, the flange 162, the sloping shoulder 164, and the substrate seating surface of 168 of the electric contact ring 152 may all be substantially co-planar to each other, thereby eliminating the distinct face of the downward sloping shoulder 164. However, for reasons described below, a preferred embodiment comprises the downward sloping shoulder 164 shown in FIG. 3 or some variation thereof.

Figure 9:
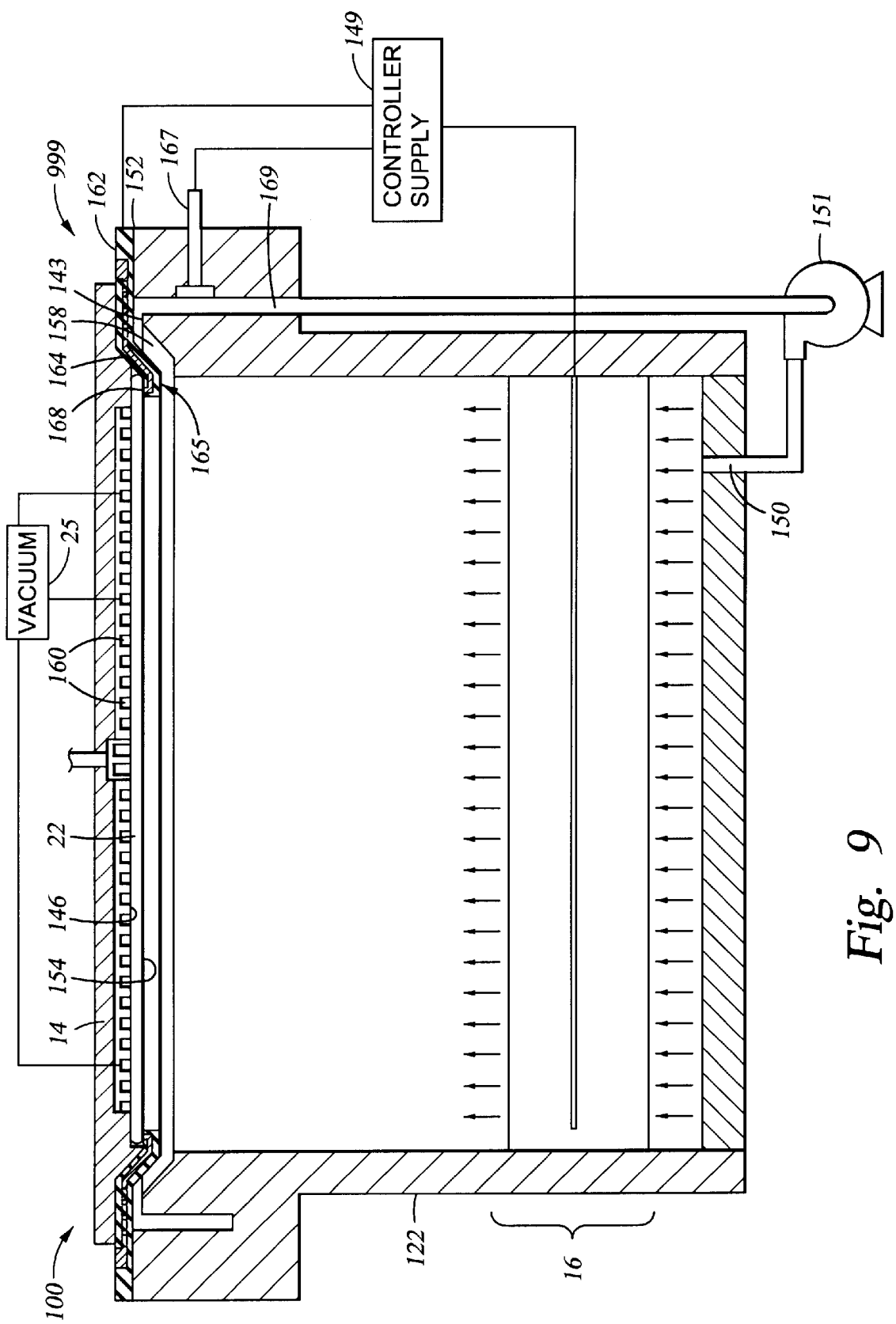
FIG. 9 is a cross sectional perspective view of another embodiment of ECD system.
Figure 10:
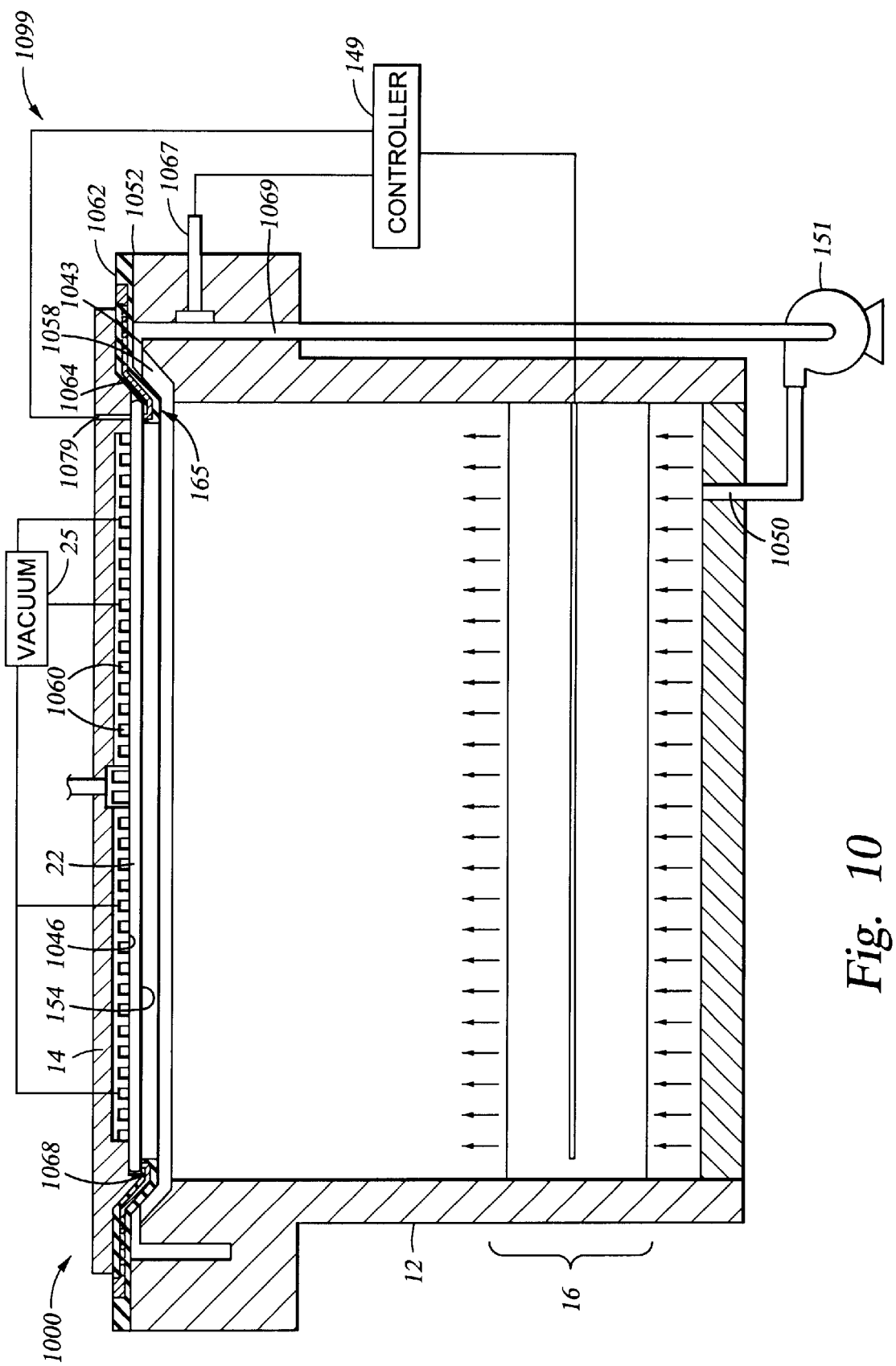
FIG. 10 is a partial cross sectional perspective view of another embodiment of ECD system.

The electric contact elements 165 are defined by a plurality of outer electric contact elements 180 annularly disposed on the flange 162, a plurality of inner electric contact elements 172 disposed on a portion of the substrate seating surface 168, and a plurality of embedded conducting connectors 176 that electrically link each inner electric contact elements 172 to the corresponding outer electric contact elements 180. The electric contact elements 165 are isolated from one another by the annular insulative body 170. The annular insulative body 170 may be made of a plastic such as polyvinylidenefluoride (PVDF), perfluoroalkoxy resin (PFA), TEFLON® (a registered trademark of the E. I. Du Pont de Nemoirs and Company of Wilmington, Del.) and TEFZEL®, or any other insulating material such as Alumina ($Al_2O_3$) or other ceramics. A similar construction of electric contact element may be provided in other embodiments of ECD system, such as shown in FIGS. 9 and 10. The outer electric contact elements 180 are coupled to a controller to deliver electric current and voltage to the inner electric contact elements 172 via the partly-embedded conducting connectors 176 during processing. In turn, the inner electric contact elements 172 supply the current and voltage to a substrate by maintaining physical contact with a peripheral portion of the substrate. Thus, in operation the electric contact elements 165 act as discrete current paths electrically connected to a seed layer on a substrate.

Low resistivity, and conversely high conductivity, are directly related to good plating. To ensure low resistivity, the electric contact elements 165 may be made of materials comprising copper (Cu), platinum (Pt), tantalum (Ta), titanium (Ti), gold (Au), silver (Ag), stainless steel or other conducting materials. Low resistivity and low contact resistance may also be achieved by coating the electric contact elements 165 with a conducting material. Thus, the electric contact elements 165 may, for example, be made of copper having an electrical resistivity of about $2 \times 10^{-8}$ Ω.m, and be coated with platinum with an electrical resistivity of about $10.6 \times 10^{-8}$ Ω.m. Additionally, because plating repeatability may be adversely affected by oxidation that acts as an insulator, the inner electric contact elements 172 may comprise a material resistant to oxidation, such as Pt, Ag, or Au. Coatings such as tantalum nitride (TaN), titanium nitride (TiN), rhodium (Rh), Au, Cu, or Ag on a conductive base materials such as stainless steel, molybdenum (Mo), Cu, and Ti may also be utilized. Further, each inner electric contact element 172 is typically a separate unit from the corresponding outer electric contact element 180, and both electric contact element 172 and 180 are bonded to the partly-embedded conducting connectors 176. In one embodiment both electric contact elements 172 and 180 may comprise one material, such as Cu, while the electric contact elements 165 comprise another material such as stainless steel. Either or both of the electric contact elements 172, 180 and conducting connectors 176 may be coated with a conducting material.

The total resistance of each circuit is both a function of the electric contact material, the geometry or shape of the inner electric contact elements 172, and the force by which the electric contact ring 152 engages a substrate. These factors define a constriction resistance, $R_{CR}$, at the interface of the inner electric contact elements 172 and the substrate seating surface 168 due to asperities between the two surfaces and the physically contacting apparent area between the two surfaces. Generally, as the applied force is increased the apparent area is also increased. The apparent area is inversely related to $R_{CR}$ so that an increase in the apparent area results in a decreased $R_{CR}$.

Figures 4, 5:
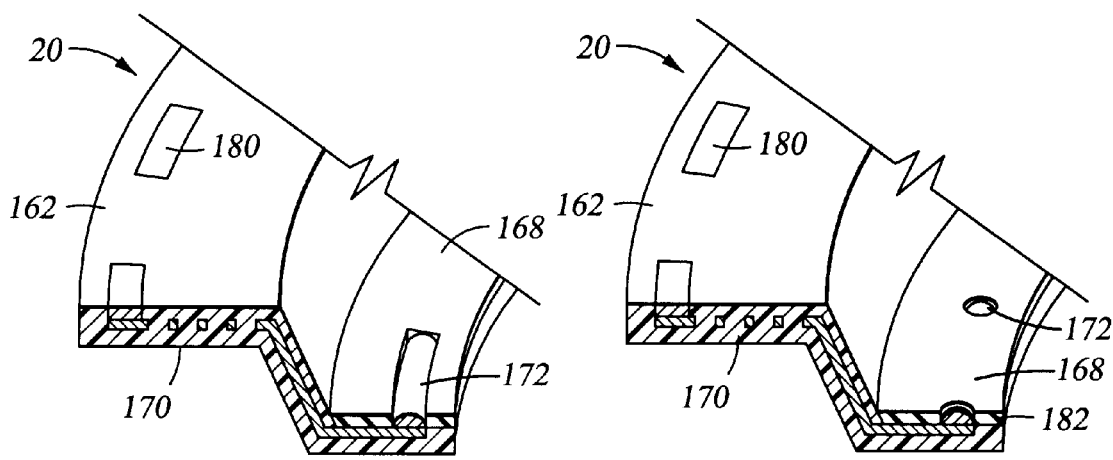
FIG. 4 is a cross sectional perspective view of the electric contact ring of FIG. 3 showing an one embodiment of electric contact elements.
FIG. 5 is a cross sectional perspective view of the electric contact ring of FIG. 3 showing yet another embodiment of the electric contact elements.

One method, to minimize overall resistance is to maximize force applied by the electric contact ring 20 to engage the substrate. The maximum force applied in operation is limited by the yield strength of a substrate that may be damaged under excessive force and resulting pressure. However, because stress applied to the electric contact elements is a function of both force and area, the maximum sustainable force is also dependent on the geometry of the inner electric contact elements 172. Thus, while the electric contact elements 172 may have a flat upper surface as in FIG. 3, other shapes may be used. For example, two preferred shapes are shown in FIGS. 4 and 5. FIG. 4 shows a curved-edge electric contact element and FIG. 5 shows a hemispherical electric contact element. A person skilled in the art will readily recognize other shapes that may be used. A more complete discussion of the relation between electric contact geometry, force, and resistance is given in *Ney Contact Manual*, by Kenneth E. Pitney, The J. M. Ney Company, 1973, which is hereby incorporated by reference in its entirety.

Figure 6:
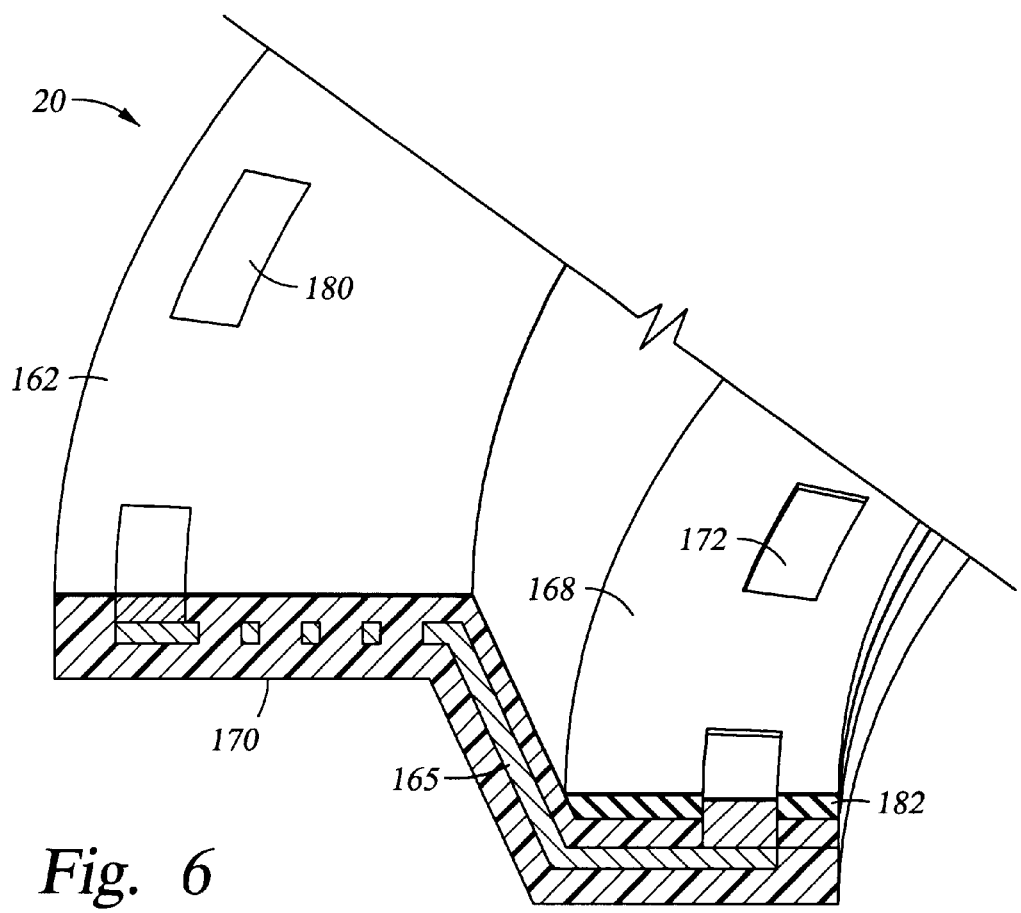
FIG. 6 is a cross sectional perspective view of the electric contact ring of FIG. 3 showing an embodiment of isolation gasket shown in FIG. 5.

As shown in FIG. 6, the substrate seating surface 168 comprises an isolation gasket 182 disposed on the annular insulative body 170. The isolation gasket extends diametrically interior to the inner electric contact elements 172 to define the inner diameter of the electric contact ring 152. The isolation gasket 182 may extend slightly above the inner electric contacts 172, e.g., a few mils, and may comprise an elastomer such as VITON® (a registered trademark of the E. I. Du Pont de Nemoirs and Company of Wilmington, Del.), TEFLON®, Buna-N™ rubber and the like. Where the annular insulative body 170 also comprises an elastomer the isolation gasket 182 may be of the same material. In the latter embodiment, the isolation gasket 182 and the annular insulative body 170 may be monolithic, i.e., formed as a single piece. However, the isolation gasket 182 is preferably separate from the annular insulative body 170 so that it may be easily removed for replacement or cleaning.

The annular insulative body 170 is partially machined away to expose the upper surface of the embedded conductive conductors 176, and the isolation gasket 182 is disposed thereon. Thus, the isolation gasket 182 contacts a portion of the embedded conductive conductor 176. This design requires less material to be used for the inner electric contact elements 172 that may be advantageous where material costs are significant such as when the inner electric contact elements 172 comprise gold. Persons skilled in the art will recognize other embodiments of isolation gaskets and electric contact elements.

During processing, the isolation gasket 182 maintains contact with a peripheral portion of the substrate seed layer and is compressed to provide a seal between the remaining cathode contact ring 152 and the substrate. The seal limits the electrolyte solution from flowing to, and contacting, the edge and backside of the substrate. As noted above, maintaining a clean electric contact surface is necessary to achieve high plating repeatability. The electric contact ring minimizes deposits that would otherwise accumulate on the inner electric contact elements 172 and change their characteristics thereby producing highly repeatable, consistent, and uniform plating across the substrate seed layer.

Figure 7:
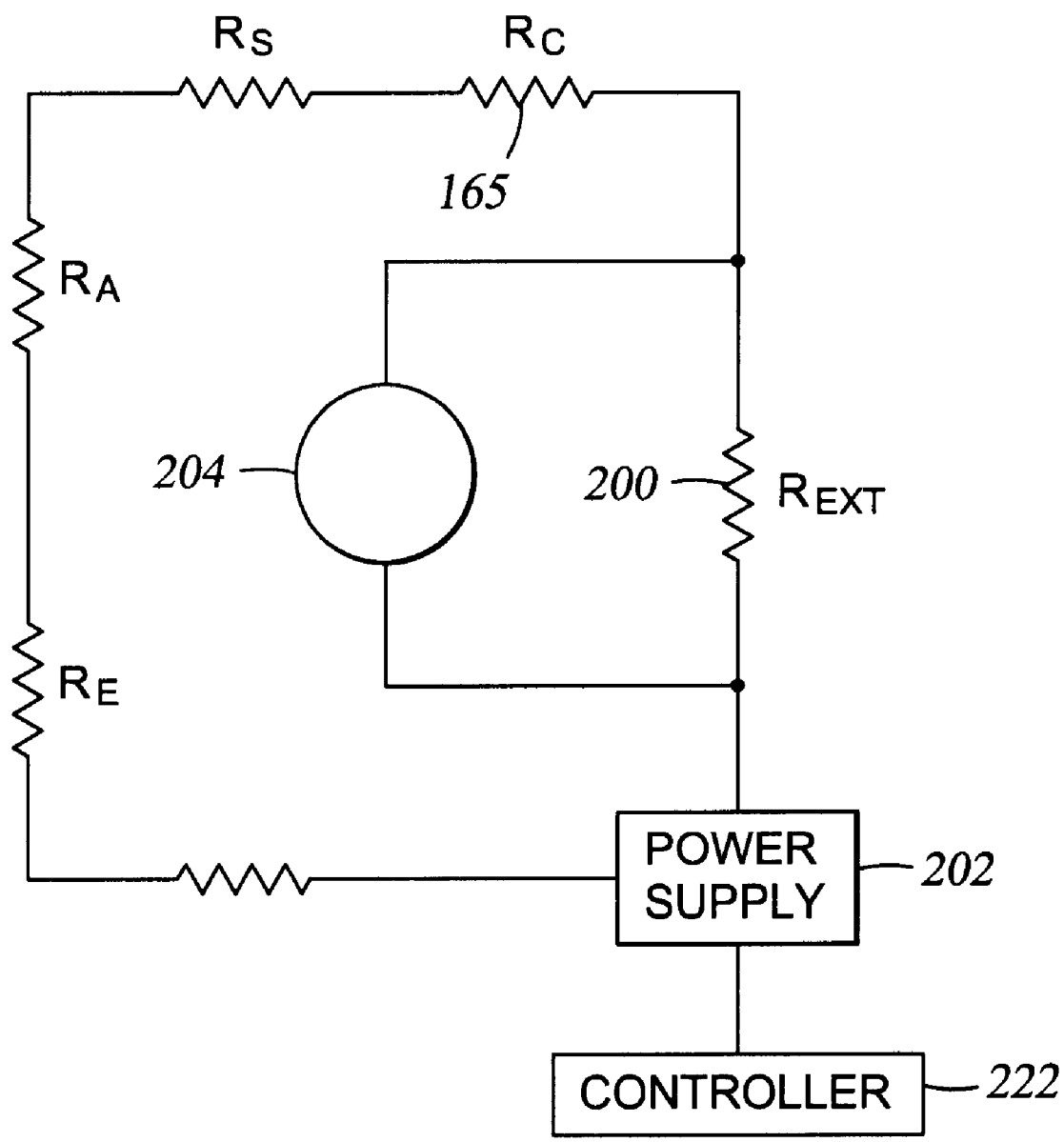
FIG. 7 is a simplified schematic diagram of one embodiment of electrical circuit representing the electroplating system through each electric contact element.

FIG. 7 is a simplified schematic diagram representing a possible configuration of the electrical circuit for the electric contact ring 152. To provide a uniform current distribution between the electric contact elements 165, an external resistor 200 is connected in series with each of the electric contact elements 165. Preferably, the resistance value of the external resistor 200 having a resistance of $R_{EXT}$ is much greater than the resistance of any other component of the circuit. The electrical circuit through each electric contact element 165 is represented by the resistance of each of the components connected in series with the controller. $R_E$ represents the resistance of the electrolyte solution, which is typically dependent on the distance between the anode and the electric contact ring and the composition of the electrolyte solution chemistry. $R_A$ represents the resistance of the electrolyte solution adjacent the substrate seed layer 154. $R_S$ represents the resistance of the substrate seed layer 154. The resistance of the cathode electric contact elements 165 plus the constriction resistance resulting at the interface between the inner electric contact elements 172 and the substrate plating layer 154 is represented by $R_C$. Generally, the resistance value of the external resistor ($R_{EXT}$) is at least as much as $\Sigma R$, where $\Sigma R$ equals the sum of $R_E$, $R_A$, $R_S$ and $R_C$. The value of $R_{EXT}$ is considerably larger than the value of $\Sigma R$ so that variances in the individual resistances $R_A$, $R_E$, $R_S$, or $R_C$ that may effect the combined resistance $\Sigma R$, do not appreciably effect the current density of the seed layer. In this manner, the current density applied to each location on the seed layer remains substantially constant during processing, regardless of any such changes and irregularities that may occur in the individual resistances $R_A$, $R_E$, $R_S$, or $R_E$.

Typically, one controller is connected to all of the outer electric contact elements 180 of the electric contact ring 152, resulting in parallel circuits through the inner electric contact elements 172. However, as the inner electric contact element-to-substrate interface resistance varies with each inner electric contact element 172, more current will flow, and thus more plating will occur, at the electric contact element site of lowest resistance. However, by placing an external resistor in series with each electric contact element 165, the value or quantity of electrical current passed through each electric contact element 165 becomes a function primarily of the external resistor value. The variations in the electrical properties between each of the inner electric contact elements 172 thus do not greatly influence the current distribution on the substrate. A uniform current density results across the seed layer that contributes to a uniform plating thickness. The external resistors also provide a uniform current distribution between different substrates of a process-sequence.

Although the electric contact ring 152 of the present invention is designed to resist deposit buildup on the inner electric contact elements 172, over multiple substrate plating cycles the substrate-electric contact element interface resistance may increase, eventually reaching an unacceptable value. An electronic sensor/alarm 204 can be connected across the external resistor 200 to monitor the voltage/current across the external resistor to address this problem. If the voltage/current across the external resistor 200 falls outside of a preset operating range that is indicative of a high substrate-electric contact element resistance, the sensor/alarm 204 triggers corrective measures such as shutting down the plating process until the problems are corrected by an operator. Alternatively, a separate controller can be connected to each electric contact element 165 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate controllers, etc. As the physiochemical, and hence electrical, properties of the inner electric contact elements 172 change over time, the VSS processes and analyzes data feedback. The data is compared to pre-established setpoints and the VSS then makes appropriate current and voltage alterations to ensure uniform deposition.

Figure 8C:
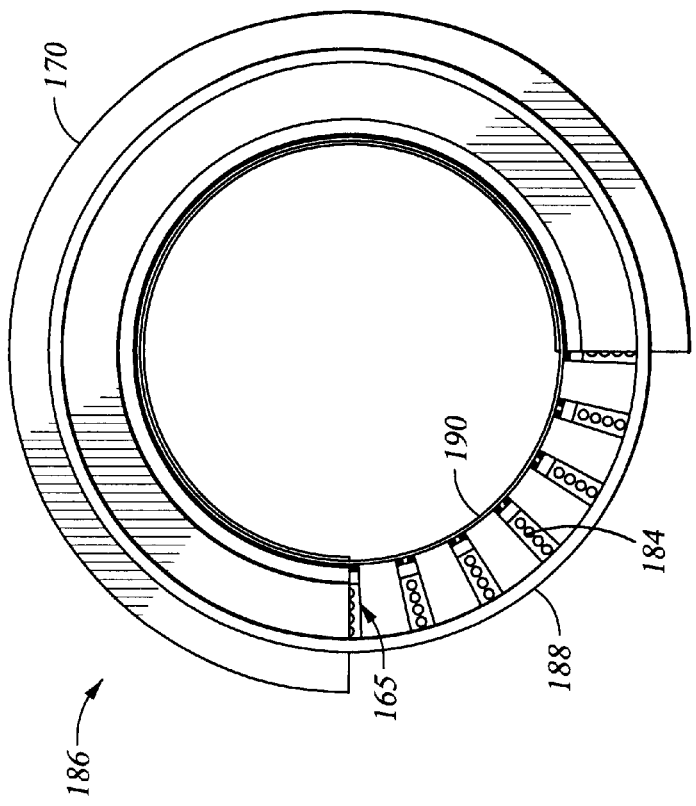
FIG. 8C is a top cutaway view of an embodiment of the electric contact ring comprising the electric contact ring conducting frame of FIG. 8A.
Figure 8A:
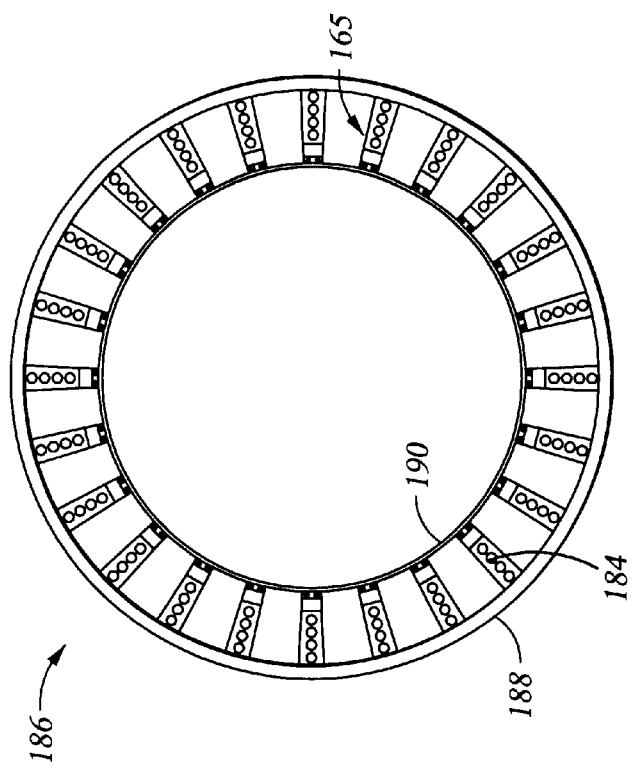
FIG. 8A is a top view of another embodiment of the electric contact ring conducting frame shown in FIG. 3.
Figure 8B:
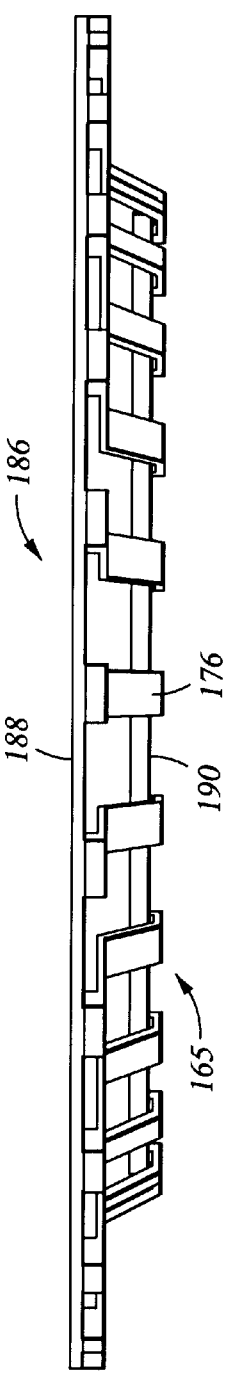
FIG. 8B is a side partial, cross sectional view of the electric contact ring conducting frame of FIG. 8A.

The construction of electric contact ring 152 is discussed. FIGS. 8A and 8B show a top view and partial cross sectional view, respectively, of a conducting frame 186 in its initial state before the annular insulative body 170, shown in FIG. 8C, is formed, or otherwise disposed, thereon. The conducting frame 186 consists of an inner conducting ring 190 and a concentric outer conducting ring 188. The rings 188, 190 are connected at intervals by the electric contact elements 165. The number of electric contact elements 165 may be varied depending on the particular number, shown in FIG. 3, that are desired. For a 200 mm substrate, preferably at least twenty-four electric contact elements 165 are spaced equally over 360°. A minimum of three electric contact elements may be provided to provide a sufficient uniformity of current density over the seed layer to effect uniform electroplating. It is envisioned that many electric contact element configurations may be provided as shown in the embodiments described below relative to FIGS. 9, 10, and 12. The number of electric contact elements desired may depend upon the embodiment or size of ECD system selected. Additionally, certain test equipment may be used to monitor the current density applied to the substrate. The configuration of the test equipment may interact best with certain electric contact element configurations. More than twenty-four conducting connectors 176 may be used as desired, such as using 36, 48, 72 or even 96 conducting connectors. Similarly, while less than twenty-four conducting connectors 176 may be used, current flow may be restricted and localized. Since the dimensions of the present invention are readily altered to suit a particular application, for example, a 300 mm substrate, the optimal number of conducting conductors may be determined by measuring the resultant variation of electric current density across the seed layer.

A fluid insulating material is then molded around the conducting frame 186 and allowed to cool and harden to form the annular insulative body 170. The material of the annular insulative body 170 is allowed to flow through a plurality of holes 184 formed in the conducting connectors 176 in order to achieve enhanced strength, durability, and integration. The upper surface of the annular insulative body 170 is then planarized such that the upper surfaces of the conducting rings 188, 190 are exposed, as shown in the top cutaway view of FIG. 8c. The individual electric contact elements 172, 180, shown in FIG. 3, are formed by machining away a portion of the conducting rings 188, 190 and annular insulative body 170 until the connecting members are removed and thus exposing discrete electric contact elements 165 encapsulated in the insulating material. Thus, the completed electric contact ring 152 consists of discrete current paths, consisting of the electric contact elements 172, 180 and the embedded conducting connectors 176, adapted to provide a current to a substrate deposition surface.

Alternatively, either or both of the conducting rings 188, 190 may be left intact. For example, the inner ring 190 may provide a single unbroken conducting surface to provide maximum surface contact with a substrate seed layer. While the electric contact elements 172, 180 and the conducting connectors 176 are treated here as discrete units, they may alternatively comprise a monolithic structure, e.g., formed as a single unit. A person skilled in the art will recognize other embodiments.

FIG. 9 is a partial vertical cross sectional schematic view of an electrochemical deposition (ECD) system 999 including an electrolyte cell 100 for electroplating a metal film onto a substrate. The electrolyte cell 100 generally comprises a electrolyte cell 12 having an opening on the top portion of the electrolyte cell 12 to receive and support a substrate holder system 14. The electrolyte cell 12 may be made of an electrically insulative material such as a plastic. The substrate holder system 14 has a substrate supporting surface 146 disposed on the lower portion thereof. A substrate 22 is shown in parallel abutment to, and supported by, the substrate supporting surface 146. The electrolyte cell 12 may be sized and shaped cylindrically to accommodate the generally circular substrate 22 by the substrate holder system 14. However, the electrolyte cell 12 may be shaped to accommodate substrates having other shapes as well. An electroplating solution inlet 150 is disposed at the bottom portion of the electrolyte cell 12. A pump 151 pumps electroplating solution into the electrolyte cell 12 such that the electroplating solution flows upwardly inside the electrolyte cell 12, past the consumable anode 16, to contact the exposed seed layer 154 on the substrate 22. In one aspect, the consumable anode 16 chemically reacts with the electrolyte solution to release metal ions into the electrolyte solution.

The electrolyte cell 12 includes an egress gap 158 bounded at an upper limit by the shoulder 164 of the electric contact ring 152 and leading to an annular weir 143 substantially coplanar with, or slightly above, the substrate seating surface 168 and thus the substrate seed layer 154. The weir 143 is positioned to ensure that the seed layer 154 is in contact with the electrolyte solution when the electrolyte solution is flowing out of the electrolyte solution egress gap 158 and over the weir 143. Alternatively, the upper surface of the weir 143 is positioned slightly lower than the substrate seed layer 154 such that the seed layer 154 is positioned just above the electrolyte solution when the electrolyte solution overflows the weir 143, and the electrolyte solution contacts the substrate seed layer 154 through meniscus properties, i.e., capillary force.

During processing, the substrate 22 is secured to the substrate supporting surface 146 of the substrate holder system 14 by a vacuum created through a plurality of vacuum passages 160 formed in the surface 146 connected to a vacuum generator 25. The electric contact ring 152 is shown disposed between the substrate holder system 14 and the electrolyte cell 12. The electric contact elements of the electric contact ring 152 connected to controller 222 to provide power to the substrate 22. The electric contact ring 152 has a perimeter flange 162 partially disposed through the substrate holder system 14, a sloping shoulder 164 conforming to the weir 143, and an inner substrate eating surface 168 that is defined corresponding to the diameter of the substrate seed layer 154. The shoulder 164 is provided so that the inner substrate seating surface 168 is located below the flange 162. This geometry allows the substrate seed layer 154 to come into contact with the electrolyte solution before the solution flows into the egress gap 158. However, as noted above, the electric contact ring design may be varied from that shown in FIG. 9 without departing from the scope of the present invention. Thus, the angle of the downward sloping shoulder 164 may be altered or the downward sloping shoulder 164 may be eliminated altogether so that the electric contact ring is substantially planar. Seals may be disposed between the electric contact ring 152, the electrolyte cell 12 and/or the substrate holder system 14 to form a fluid tight seal therebetween.

The substrate seating surface 168 extends a minimal radial distance inward below a perimeter edge of the substrate 148, that is sufficient to establish electric contact element with a metal seed layer on the substrate deposition surface 154. The exact inward radial extension of the substrate seating surface 168 may be varied according to application. However, in general this distance is minimized so that a maximum deposition surface 154 is exposed to the electrolyte solution. In one embodiment, the radial width of the seating surface 168 is about 2 mm from the edge.

In operation, the electric contact elements of the electric contact ring 152 are negatively charged to act as a cathode relative to the anode. As the electrolyte solution flows to the substrate seed layer 154, the positively charged metal ions in the electrolyte solution are attracted to the surface 154. The metal ions then impinge on the surface 154 to react therewith to form the desired film. In addition to the anode 16 and the cathode contact ring 152, an auxiliary electrode 167 may be used to control the shape of the electric field over the substrate seed layer 154. The auxiliary electrode 167 is shown here disposed through the electrolyte cell 12 adjacent an exhaust channel 169. By positioning the auxiliary electrode 167 adjacent to the exhaust channel 169, the electrode 167 is able to maintain contact with the electrolyte solution during processing and affect the electric field.

II. Electric Contact Elements that Physically Contact the Backside or the Edge of Substrate Multiple embodiments of ECD systems are now described in which electric contact elements physically contact either the backside or the edge of the substrate 22. With the electric contact elements contacting the backside or edge of the substrate seed layer, the electric contact elements will not be immersed in the electrolyte solution that contacts the front of the substrate (the frontside faces generally downward during immersion) during the deposition of the metal film on the substrate seed layer. Therefore, few metal ions from the electrolyte solution are deposited on the electric contact elements in these embodiments. Additionally, since the electric contact elements are not positioned between the substrate and the support element in these embodiments, it is easier to provide an effective seal that limits leakage of the electrolyte solution between the substrate and the support element from the front side of the substrate around to the substrate backside.

Figure 11:
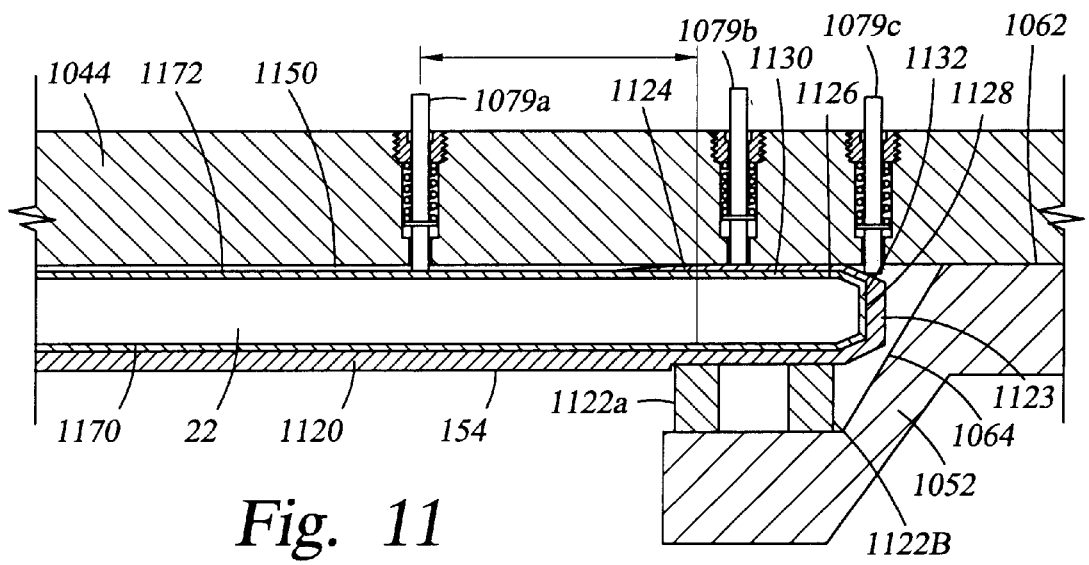
FIG. 11 is a partial cross sectional side view of a portion of one embodiment of the substrate holder assembly and substrate of FIG. 10 indicating three locations for positioning electric contact elements.
Figure 12:
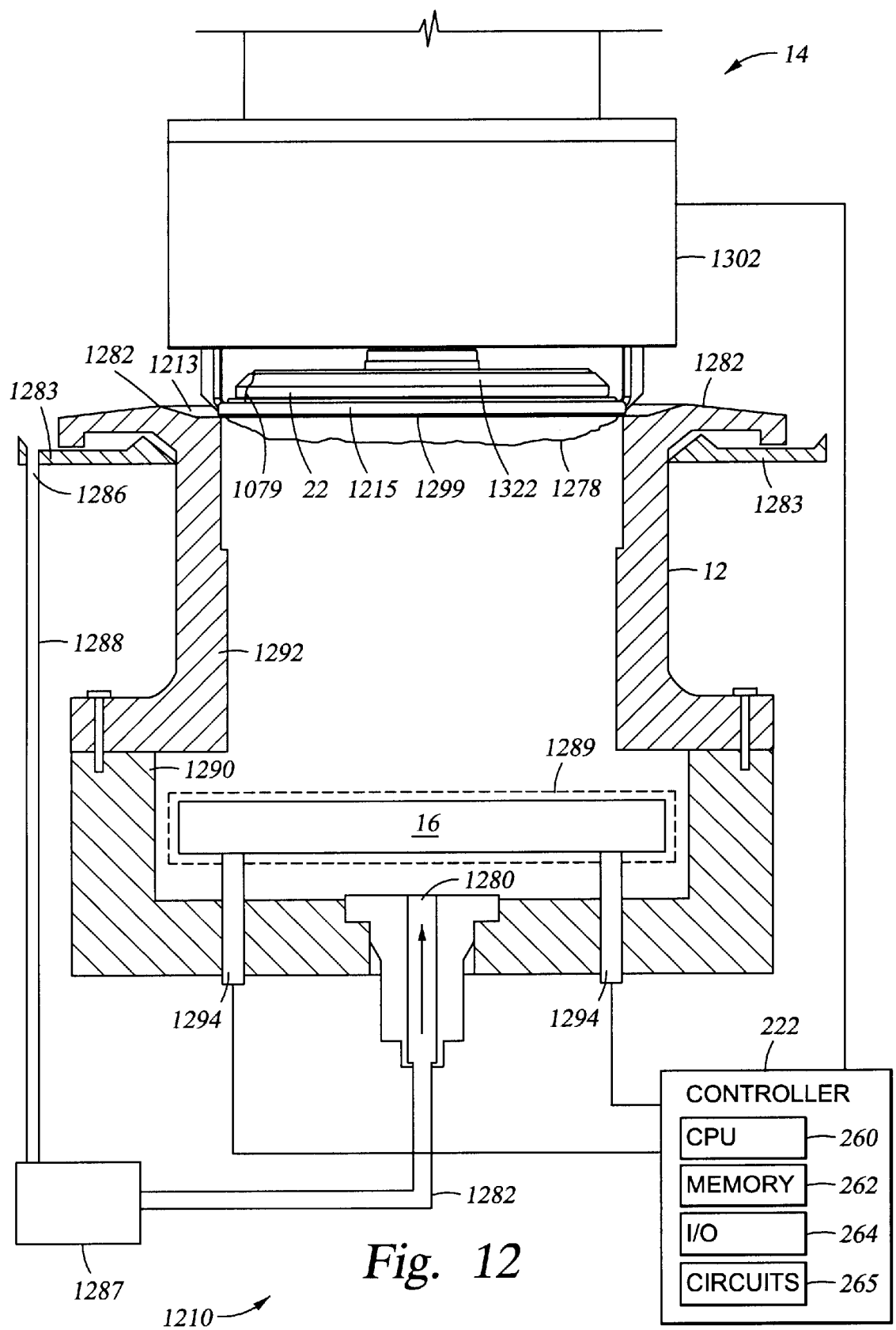
FIG. 12 is a cross sectional side view of another embodiment of ECD system.

FIGS. 10, 11, 12, 13, 14, 15, and 16 show aspects of multiple embodiment of ECD system in which the electric contact elements touch the backside or edge of the substrate 22. FIG. 10 shows one such embodiment of ECD system 1099 in which the substrate holder system 14 holds the substrate 22 in electrolyte solution contained in the electrolyte cell 12 in a manner that the substrate holder system does not rotate the substrate about a vertical axis relative to the electrolyte cell. FIG. 12 shows another such embodiment of ECD system 1210 in which the substrate holder system 14 positions the substrate 22 in the electrolyte solution contained in the electrolyte cell 12 in a manner that the substrate holder system 14 rotates the substrate about a vertical axis while the substrate is positioned within the electrolyte cell. These embodiments are described in detail.

FIG. 10 is a partial cut-away perspective view of another embodiment of the ECD system 1099 including an electrolyte cell 1000. The electrolyte cell 1000 comprises the electrolyte cell 12 having an upper opening that is configured to receive a substrate holder system 14. A substrate 22 held by the substrate holder system 14 does not rotate about a substantially vertical axis relative to the electrolyte cell 12 during processing. The components and materials in the embodiment of substrate holder assemblies and electric contact elements shown in the embodiments in FIGS. 10 to 16 are similar to those embodiments described in FIGS. 1–9. The electrolyte cell 12 may be preferably made of an electrically insulative material such as a plastic. The substrate holder system 14 has a substrate supporting surface 1046 disposed on the lower portion thereof. A substrate 22 is shown in parallel abutment to and supported by the substrate supporting surface 1046. The substrate is secured on the substrate holder system 14 during processing. A vacuum can be applied to grooves 1060 formed in the substrate supporting surface 1046 so the substrate is held by the substrate supporting surface when the later is lifted from the substrate cell 12) by a vacuum generated by a vacuum generator 25. The vacuum generated by the vacuum generator 25 is communicated through a plurality of vacuum passages 1060 formed in the substrate supporting surface 1046. An electrolyte solution inlet 1050 is disposed at the bottom portion of the electrolyte cell 12.

A pump 1051 pumps electrolyte solution into the electrolyte solution inlet 1050 such that the electrolyte solution generally flows upwardly inside the electrolyte cell 12 past the consumable anode 16 and toward the substrate 22 to contact the exposed substrate seed layer 154. A consumable anode 16 is disposed in the electrolyte cell 12. The consumable anode chemically reacts with the electrolyte solution to release metal ions into the electrolyte solution. The flow of the electrolyte solution assists in transporting metal ions contained in the electrolyte solution from the anode to the substrate layer for the metal film deposition.

The electrolyte cell 12 comprises a support element 1052 that is configured to non-rotatably support the substrate holder system 14 relative to the electrolyte cell 12. The electrolyte cell 12 includes an egress gap 1058 bounded at an upper limit by the support element 1052. The support element 1052 is preferably formed of an elastomeric material that forms a seal to limit fluid flow of electrolyte solution from within the electrolyte cell 12 to the space between the substrate 22 and the support element 1052. The electrolyte cell 12 forms one side of an annular weir 1043 at a location substantially coplanar with the substrate seating surface 1068. The weir 1043 is positioned at a vertical level to ensure that the seed layer 154 on the substrate 22 is in physical contact with the electrolyte solution when the electrolyte solution is flowing out of the electrolyte solution egress gap 1058 and over the weir 1043. Alternatively, the upper surface of the weir 1043 is positioned slightly lower than the seed layer, and the electrolyte solution flows into contact with the seed layer 154 using meniscus properties, i.e., capillary force.

Figure 14:
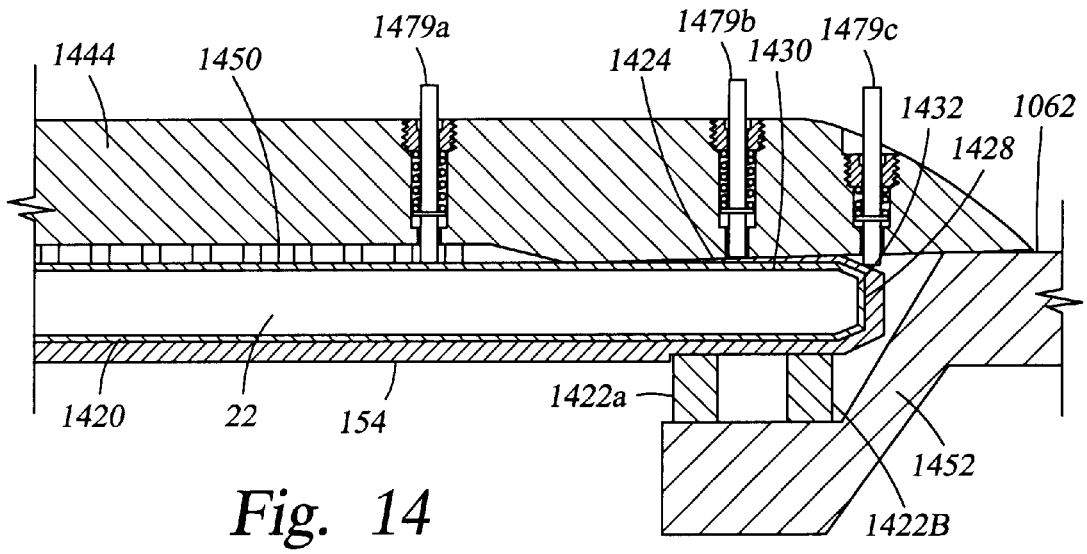
FIG. 14 is a partial cross sectional view of one embodiment of a head assembly of the substrate holder system of FIG. 13.

FIG. 11 shows electric contact elements 1079a, 1079b, or 1079c that represent three distinct locations that electric contact elements 1079 of the ECD system of FIG. 10 may be positioned relative to the substrate to electrically contact the seed layer on the substrate 22. All electric contact element positions 1079a, 1079b, or 1079c shown in FIG. 11 are indicated in FIG. 10 generally as 1079. Each one of the indicated positions of electric contact elements 1079a, 1079b, or 1079c is indicative of the cross sectional locations of a plurality of radially-spaced electric contact elements positioned about the periphery of the substrate. The seed layer 154 shown in the embodiment of FIG. 11 comprises a front plating surface portion 1120, an edge plating surface portion 1123, and a backside plating surface portion 1124. The edge plating surface portion 1123 includes a bevel plating surface portion 1126 and a peripheral edge plating surface portion 1128. The bevel plating surface portion 1126 is applied over the bevel 1130 of the substrate 22 while the peripheral edge plating surface 1128 is applied over a circumferential edge 1132 of the substrate 22. The front plating surface portion 1120 extends over a front side 1170 or plating surface, of the substrate. The backside 1170 of the substrate is located on the opposite side of the substrate as the front side 1170 of the substrate. FIGS. 11 and 14 show the seed layer as extending from the front side of the substrate around the edge, to cover a portion of the backside of the substrate. The concept of applying the electrical contact element to contact the edge or the backside of the wafer may also be utilized if the seed layer is applied to only the front side of the substrate, or alternatively only the front side and some or all of the edge of the substrate.

Though several embodiments of substrates 22 are described as including a seed layer backside plating surface portion 1124 and an edge plating surface portion 1123, it is envisioned that the electric contact elements may be applied to any portion of the seed layer or diffusion barrier on the substrate at any backside, edge, or bevel portion of the substrate. The diffusion barrier layer that is applied to the front side of a substrate by such processing techniques as physical vapor deposition (PVD) or chemical vapor deposition (CVD) also typically extend to cover at least a portion of the edge of the substrate, and a bevel 1130 of the substrate at depths approaching several hundred angstroms. The diffusion barrier layer and/or the seed layer applied by such processes as PVD or CVD also typically extend around the backside of the substrate by a distance of over a millimeter for certain systems.

The diffusion barrier layer and/or the seed layer may extend around the backside of the seed layer. The diffusion barrier layer is typically formed from a metal such as Ta or TaN that has sufficient conductivity to allow sufficient electric current to flow to the seed layer to cause a sufficient electric current density to be generated in the seed layer on the front side of the substrate. One factor that is related to the resistance of the diffusion barrier layer is the distance shown by arrow d that the seed layer is separated from the electric contact element across the diffusion barrier layer. For example, if a dc power source supplies the electric current to the electric contact elements, the distance shown by arrow d should preferably be less than several centimeters to allow sufficient electric current to flow from the electric contact elements to the seed layer to generate the desired electric current density to the seed layer. The maximum distance shown by arrow d at which the electric contact element can be separated from the seed layer can be increased if the electric supply applied to the electric contact elements is an RF electric power source instead of a DC electric power source. This increased separation distance d of RF electric current results since, among other factors, that the surface electric conduction using RF electric current is typically greater than using DC electric current.

FIG. 10 shows the different positions that the electric contact element may contact the seed layer or the diffusion barrier layer. One embodiment of electric contact element 1079a is disposed in physical and electrical contact with diffusion barrier layer 1150 spaced by a horizontal distance d from the backside plating surface portion 1124. Another embodiment of electric contact element 1079b is disposed in physical and electrical contact with the seed layer deposited on the backside plating surface portion 1124 on the substrate. Yet another embodiment of the electric contact element 1079c is disposed in physical and electrical contact with one of the bevel plating surface portion 1126 or the peripheral edge plating surface portion 1128 on the substrate.

An electrical controller 222 controls the electrical current supplied to each one of the plurality of electric contact elements 1079a, 1079b, or 1079c. The support element 1052 may comprise a peripheral flange 1062, a sloping shoulder 1062, and an inner substrate seating surface 1068. The peripheral flange 1062 is partially disposed through the substrate holder system 14. The sloping shoulder 1064 conforms to the weir 1043 as shown in FIG. 10. The inner substrate seating surface 1068 forms a surface to support the substrate during processing. The purpose of the sloping shoulder 1064 is to position the inner substrate seating surface 1068 below the peripheral flange 1062. This geometry allows the substrate seed layer 154 to contact the electrolyte solution as the electrolyte solution flows into the egress gap 1058 shown in the embodiment of FIG. 11. Also shown in the embodiment of FIG. 11 are two annular seals 1122a and 1122b that seal between the support element 1052 and the downward-facing plating surface 1170 of the substrate 22. Alternatively, using a single annular seal, or three or more spaced annular seals, are within the concepts of the ECD system. The inner annular seal 1122a extends circumferentially relative to a seated substrate. The outer annular seal 1122b also extends circumferentially relative to the substrate 22 and extends radially outside of the inner annular seal 1122a.

The electrolyte solution contained in the electrolyte cell 12 has to flow past annular seal 1122a before it encounters annular seal 1122b. The use of the two annular seals 1122 and 1122b in series thus forms a complex seal extending between the support element 1052 and the substrate. The combination of annular seals 1122a and 1122b therefore limit the passage of electrolyte solution from within the electrolyte cell 12 to the space around the edge and/or backside of the substrate 22. The seals 1122a and 1122b each contact the front of the substrate at or near the periphery of the substrate 22. The contact point of the seals limit metal ion deposition on the substrate at those locations radially outward of the seal 1122a since metal ion deposition will not occur or between, the annular seals 1122a and 1122b. The positioning of electric contact elements provide for the design and configuration of annular seals 1122a and 1122b that are physically separate from the electric contact elements. Since the annular seals 1122a and 1122b both circumferentially seal between two planar faces, and do not have to seal against irregularly-shaped electric contact elements, the sealing quality of annular seals 1122a and 1122b is highly effective.

The support element design may be varied from the design shown in FIGS. 10 and 11 without departing from the scope of the present invention. Thus, the angle of the downward sloping shoulder 1064 may be altered or the downward sloping shoulder 1064 may be eliminated altogether so that the sloping shoulder 1064, the peripheral flange 1062, and the substrate seating surface 1068 of the support element 1052 define a substantially co-planar surface.

In operation, the electric contact element 1079 shown in FIG. 10, which represents one or more of the electric contact elements 1079a, 1079b, or 1079c shown in FIG. 11 that are positioned about the periphery of a substrate, is negatively charged relative to the anode 16. The electric contact element 1079 is electrically connected to the seed layer 154 which causes the seed layer to act as a cathode. As the electrolyte solution is applied across the substrate seed layer 154 on the frontside 1130, the metal ions contained in the electrolyte solution are attracted to deposit onto the seed layer 154 and form a metal film. The electrolyte solution includes metal ions from two sources. The recirculation/refreshing portion acts as a first source of metal ions for the electrolyte solution that applies the metal ions into the electrolyte solution prior to when the electrolyte solution enters the electrolyte cell through the electrolyte solution inlet 1050. The second source of metal ions into the electrolyte solution is a chemical reaction between the anode 16 and the electrolyte solution that releases metal ions into the electrolyte solution. The metal ions impinge on the seed layer 154 to deposit the desired metal film. In addition to the anode 16 and the electric contact element 1079, an auxiliary electrode 1067 may be used to control the shape of the electric field, and the resulting electric current density, over the substrate seed layer 154. The auxiliary electrode 1067 may be disposed through the electrolyte cell 12 adjacent an exhaust channel 1069.

Figure 15:
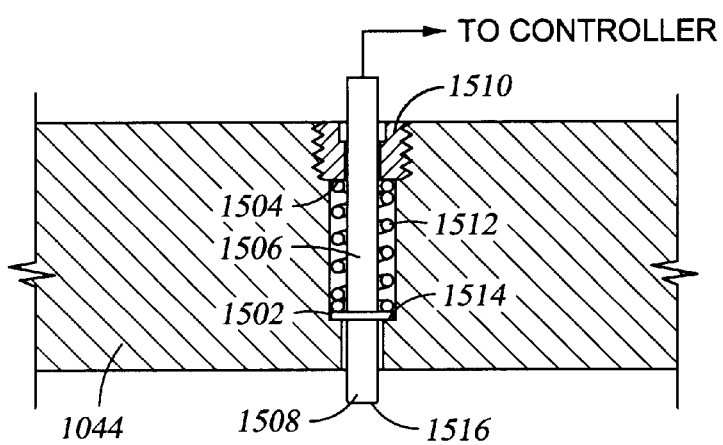
FIG. 15 is a side cross sectional view of one embodiment of an electrode in a substrate holder assembly.

FIG. 15 shows an embodiment of biased electric contact element 1079 that may be used as the electric contact element 1079a, 1079b, or 1079c shown in FIG. 11, or as electric contact element 1479a, 1479b, or 1479c shown in FIG. 14. The biased electric contact element 1079 fits within a recess 1502. The electric contact element 1079 includes upper electric contact element 1504, biasing member 1506, for example a spring, and lower electric contact element 1508. In one embodiment, the upper electric contact element 1504, the lower electric contact element 1508, and the biasing member 1506 are each electrically conductive. The upper electric contact element 1504 and the lower electric contact element 1508 are both configured to fit within the recess 1502, respectively above and below the biasing member 1506.

The upper electric contact element 1504 and the lower electric contact element 1508 are both in contact with the biasing member 1506. The biasing member 1506, that is formed as a cylindrical electrically-conductive spring, forces the lower electric contact element 1508 downwardly into contact with a substrate 22. Alternatively, a spring member, that is distinct from the biased electric contact element, may force the electric contact element 1079 downward into contact with the substrate. The controller 222 controls the electricity supplied to the upper electric contact element 1504. The upper surface 1512 of the biasing member 1506 remains in contact with an upper ledge 1510 partially defining recess 1502 when the electric contact element is in contact with the substrate. The biasing member 1506 can be compressed or decompressed by, axial motion of the lower electric contact element 1508. A lower face 1516 of the lower electric contact element 1508 is biased against a substrate by sufficient force to provide an effective electric contact element between the electric contact element and the substrate 22. The lower face 1516 is forced against the substrate with a lesser force than could damage the substrate. The upper electric contact element 1504 can be rigidly mounted, fastened, free-floating, or formed within the recess 1502 in substrate holder system 14. Alternately, the types of electric contact elements and/or isolation gaskets shown in the embodiments of FIGS. 4–6 could also be used as electric contact element 1079.

Figure 13:
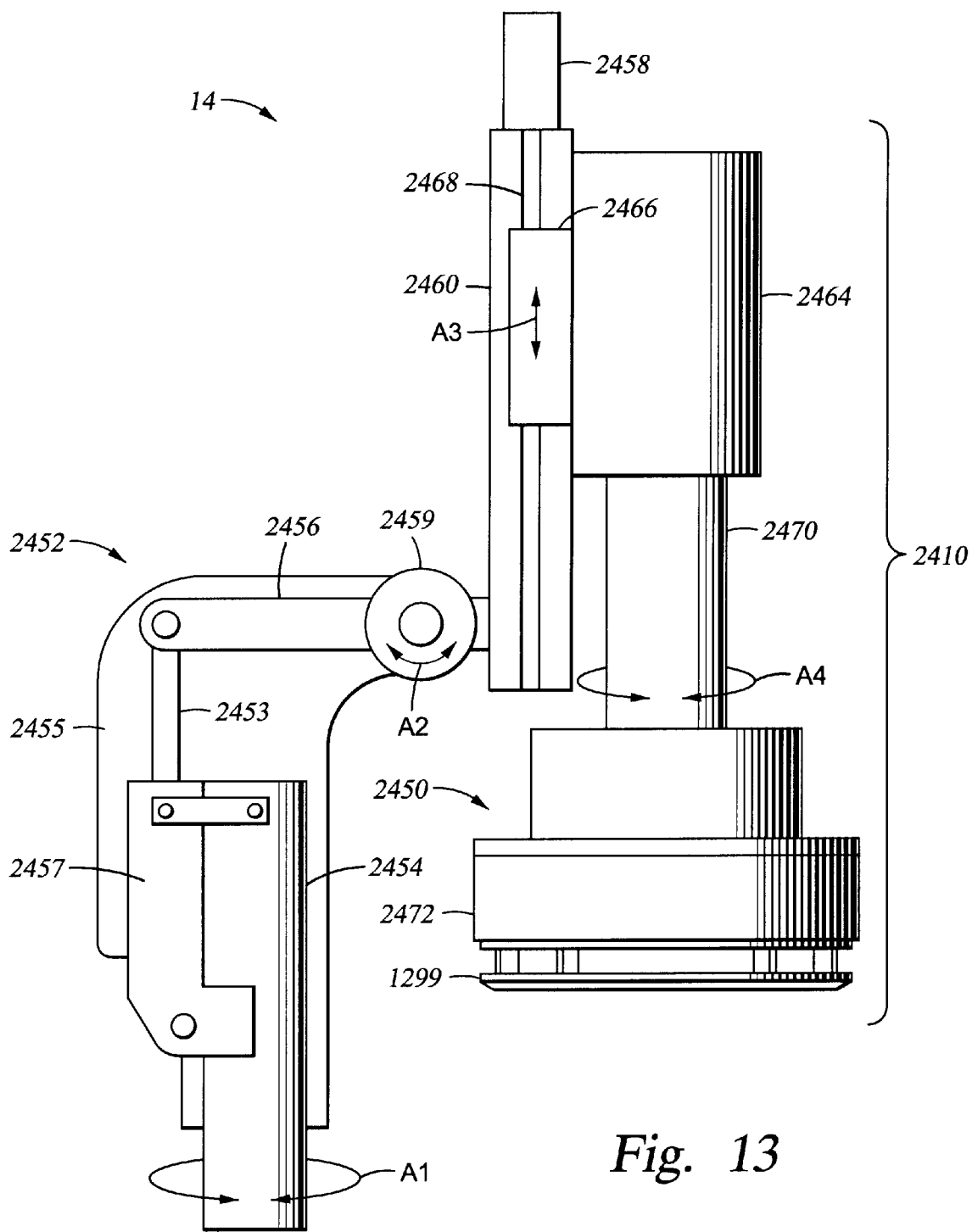
FIG. 13 is a partial side cross sectional view of one embodiment of substrate holder system used with the ECD system of FIG. 12.

FIG. 13 is a partial cross sectional view of another embodiment of a substrate holder system 14 that is capable of translating a substrate holder assembly 2450 in the horizontal and vertical directions to immerse a substrate into, or remove a substrate from, electrolyte solution within an electrolyte cell. The ECD system provides for rotation of the substrate during immersion of the substrate into the electrolyte solution where the substrate is held by the substrate holder assembly 2450. The embodiment of a substrate holder system 14 shown in FIG. 13 may also provide for tilting of the substrate holder assembly 2450 at an angle α from horizontal in addition to the -translation of the substrate holder assembly in a horizontal X-direction and the vertical Z-direction. The substrate holder system 14 includes a head rotation assembly 2410 and a head assembly frame 2452. The head assembly frame 2452 includes a mounting post 2454, a shaft 2453, a post cover 2455, a cantilever arm 2456, a cantilever arm actuator 2457, and a pivot joint 2459. The mounting post 2454 is mounted onto the body of the mainframe 214, and the post cover 2455 covers a top portion of the mounting post 2454.

The mounting post 2454 provides rotational movement, in a direction indicated by arrow A1, of the mounting post to allow for rotation of the head assembly frame 2452 about a substantially vertical axis which extends through the mounting post. Such motion is generally provided to displace the head assembly 2410 to be aligned with the electrolyte cell.

One end of the cantilever arm 2456 is pivotally connected to the shaft 2453 of the cantilever arm actuator 2457. The cantilever arm actuator 2457 is, for example, a pneumatic cylinder, a lead-screw actuator, a servo-motor, or other type actuator. The cantilever arm 2456 is pivotally connected to the head lift 2460 at the pivot joint 2459. The cantilever arm actuator 2457 is mounted to the mounting post 2454. The pivot joint 2459 is rotatably mounted to the post cover 2455 so that the cantilever arm 2456 can pivot about the post cover at the pivot joint. Actuation of the cantilever arm actuator 2457 provides pivotal movement, in a direction indicated by arrow A2, of the cantilever arm 2456 about the pivot joint 2459. Alternatively, a rotary motor may be provided as a cantilever arm actuator 2457, wherein output of a rotary motor is connected directly between the post cover 2455 and the pivot joint 2459. The rotary motor output effects rotation of the cantilever arm 2456 and the head assembly 2410 about the pivot joint.

The head rotation assembly 2410 is attached to a head lift 2460 of the head assembly frame 2452, and the head lift 2460 is disposed at the distal end of the cantilever arm 2456. Rotation of the head rotation assembly 2410 about the pivot joint 2459 causes tilting of a substrate held within the substrate holder assembly 2450 of the head rotation assembly 2410 about the pivot joint 2459 relative to horizontal. When the cantilever arm actuator 2457 is retracted, the cantilever arm 2456 raises the head assembly 2410 away from the process cell 420. This tilting of the head rotation assembly 2410 effects tilting of the substrate relative to horizontal. The substrate may be tilted by the substrate holder system 14 during removal and/or replacement of the substrate holder assembly 2450 that contains the substratefrom/to the electroplating process cell 240. Such tilting of the substrate during immersion of the substrate into the electrolyte solution is provided to limit air being trapped under the substrate, or between the substrate and the electric contact elements. Such tilting of the substrate during immersion also enhances the flow of the meniscus, formed by the contact between the electrolyte solution and the substrate, across the plating surface of the seed layer. When the cantilever arm actuator 2457 is extended, the cantilever arm 2456 moves the head assembly 2410 toward the process cell 420 to angle the substrate toward to horizontal. The substrate is preferably in a substantially horizontal position during the majority of ECD processing.

The head rotation assembly 2410 includes a rotating actuator 2464 slidably connected to the head lift 2460. The head lift 2460 guides the vertical motion of the head rotation assembly 2410. A head lift actuator 2458 is disposed on the head lift 2460 to provide motive force for vertical displacement of the head assembly 2410. The shaft 2468 that is rotated by the head lift actuator 2458 is inserted through a lift guide 2466 attached to the body of the rotating actuator 2464. In one embodiment, the shaft 2468 is a lead-screw type shaft that moves the lift guide, in a direction indicated by arrow A3, between various vertical positions. This lifting of the head rotation assembly 2410 can be used to remove and/or replace the substrate holder assembly from the electroplating process cell 240. Removing the substrate from the process cell is necessary to position the substrate so that a robot can remove the substrate from the head rotation assembly 2410.

The rotating actuator 2464 is connected to the substrate holder assembly 2450 through the shaft 2470 and rotates the substrate holder assembly 2450 in a direction indicated by arrow A4. The rotation of the substrate during the electroplating process generally enhances the deposition results. In one embodiment, the head assembly rotates the substrate about the vertical axis of the substrate between just above 0 RPM and about 200 RPM, preferably between about 10 RPM and about 40 RPM, during the electroplating process. Rotation of the substrate at a higher angular velocity may result in turbulence within the electrolyte solution. The head assembly can also be rotated as the head assembly is lowered to position the substrate in contact with the electrolyte solution in the process cell as well as when the head assembly is raised to remove the substrate from the electrolyte solution in the process cell. The head assembly may be preferably rotated at a high speed, e.g., up to about 2,500 RPM, after the head assembly is lifted from the process cell. Such rotation of the substrate following the removal of the substrate from the electrolyte solution enhances removal of residual electrolyte solution on the substrate by the centrifugal force applied to the liquid on the substrate.

Figure 16:
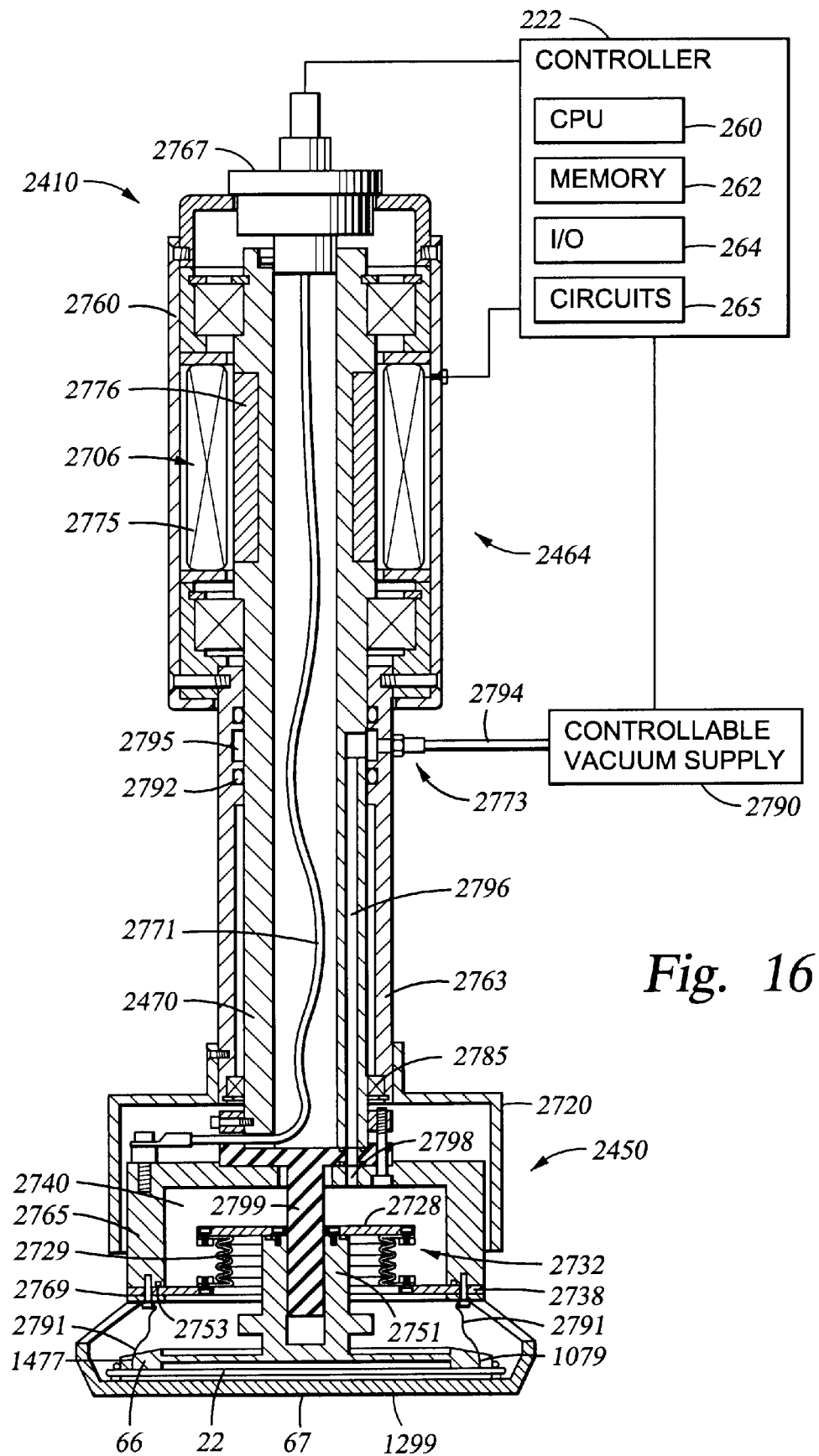
FIG. 16 is a side cross sectional view of one embodiment of head assembly of the substrate holder system of FIG. 13.

FIG. 16 shows a cross sectional view of one embodiment of head rotation assembly 2410 that can be contained in the substrate holder system 14 of the embodiment shown in FIG. 13 to provide for the rotation of the substrate. The head rotation assembly 2410 provides for lowering of the thrust plate 66 to physically bias the substrate into contact with the support element 1299. The thrust plate can be raised to provide a space between the thrust plate 66 and the support element 1299 to permit removal of the substrate from, or insertion of the substrate into, the head rotation assembly 2410 using a robot device. The head rotation assembly 2410 comprises a substrate holder assembly 2450, a rotating actuator 2464, a shaft shield 2763, a shaft 2470, an electric feed through 2767, an electric conductor 2771, and a pneumatic feed through 2773. The rotating actuator 2464 comprises a head rotation housing 2760 and a head rotation motor 2706. The head rotation motor 2706 comprises a coil segment 2775 and a magnetic rotary element 2776. The hollow coil segment 2775 generates a magnetic field that forces the magnetic rotary element 2776 to rotate about a vertical axis. Since the magnetic rotary element 2776 is attached to the shaft 2470, the shaft 2470 is also caused to rotate about a vertical axis. The substrate holder assembly 2450 comprises a fluid shield 2720, a contact housing 2765 a thrust plate 66, an electric contact element 1079, a support element 1299 and a spring assembly 2732.

The contact housing 2765 and the spring assembly 2732 are generally annular, and these two elements interfit and provide for a combined rotation that is transferred to the thrust plate 66 and the support element 1299. The spring assembly 2732 comprises an upper spring surface 2728, a spring bellow connector 2729, and a lower spring surface 2738. Seal element 2751 seals the fluid passage between the upper spring surface 2728 and the thrust plate 66. Seal element 2753 seals the fluid passage between the lower spring surface 2738 and the contact housing 2765.

Electricity is supplied to the electric contact element 1079 that contacts the backside or edge of the substrate, as shown in FIG. 11, to provide a desired voltage between the anode 16 and the seed layer on the substrate to effect the electroplating process. Electricity supplied to the electric contact element 1079 via the electric feed through 2767, an electrical conductor 2771, the contact housing 2765, and electrical conductor 2791, under the control of the controller 222. An insulative member 2769 is provided between the contact housing 2765 and the support element 1299 to limit electric current that is intended to flow to the electric contact elements 1079 from being shunted to flow instead via the contact housing 2765 to the support element 2767. Additionally, the support element 2767 is preferably formed from a non-electrically conductive material. The electric contact element 1079 is in physical, and electrical, contact with the seed layer on the substrate.

The shaft 2470, the contact housing 2765, the spring assembly 2732, the thrust plate 66, the electric contact element 1079, the support element 1299, the rotary mount 2799, and the substrate 22 secured all rotate as a unit about a longitudinal axis of the head assembly 2410. The head rotation motor 2706 provides the motive force to rotate the above elements about its vertical axis.

A vacuum is controllably supplied by a controllable vacuum supply 2790 to portions of the head rotation assembly 2410 via the pneumatic feed through 2773 to control the position of the thrust plate relative to the support element 1299. The pneumatic feed through 2773 comprises the controllable vacuum supply 2790, a sleeve member 2792, a fluid conduit 2794, a circumferential groove 2795, a fluid aperture 2796, and a fluid passage 2798. The sleeve member 2792 may be a distinct member, or a portion of the shaft as shown in FIG. 16. The circumferential groove 2795 extends within the sleeve member 2792 about the circumference of the shaft 2470. The controllable vacuum supply 2790 supplies a vacuum via pneumatic feed through 2773 to a pressure reservoir 2740. The pressure reservoir may be configured to provide either positive air pressure or a vacuum, depending upon the pressures applied within the head assembly 2410. To transfer the vacuum supplied by the controllable vacuum supply 2790 to the pressure reservoir 2740, the fluid aperture 2796 is in fluid communication with the circumferential groove. The fluid aperture 2796 extends axially through the shaft 2470 from the circumferential groove 2795 to the bottom of the shaft 2470. The fluid passage 2798 extends through the contact housing 2765. The fluid aperture 2796 at the bottom of the shaft is in fluid communication with the fluid passage 2798. The inner surface of the sleeve member 2792 has a small clearance, e.g. about 0.0002 inch, with the outer surface of the shaft 2470 to allow relative rotation between these two members.

A vacuum is applied from the controllable vacuum supply 2790 via the fluid conduit 2794 to the inner surface of the sleeve member 2792 and the circumferential groove 2795. The vacuum is applied from the fluid aperture 2796 to the fluid passage 2798 and the pressure reservoir 2740. Due to the tight clearance between the sleeve member 2792 and the shaft 2470, a vacuum applied to the inner surface of the sleeve member 2792 passes via the circumferential groove 2795 to the fluid aperture 2796. The tight clearance limits air entering between the sleeve member 2792 and the outer surface of the shaft 2470. Therefore, the vacuum applied from the controllable vacuum supply 2790 extends to the pressure reservoir. A vacuum within the shaft 2470 passes through the fluid passage 2798 to a pressure reservoir 2740 formed between the spring assembly 2732 and the contact housing 2765. The vacuum applied by the controllable vacuum supply 2790 thereby controls the vacuum in the pressure reservoir 2740.

The spring bellow connector 2729 combines aspects of a spring and a bellows. The spring bias connector 2729 is attached between the thrust plate 66 and the contact housing 2765. The spring bellows connector 2729 limits fluid flow between the thrust plate 66 and the electric contact element 1079. The spring bellows connector 2729 additionally exerts a spring force when axially displaced, either compressed or extended, from its relaxed shape. The bias of the spring bellow connector 2729 is used to position the thrust plate 66 relative to the electric contact element 1079. Any suitable type of bellows or baffle member that has a spring constant may be used as spring bellow connector 2729. Alternatively, separate spring and bellows members may be used as the spring bellow connector 2729. The upper spring surface 2728 is annular shaped and is sealably connected to the thrust plate 66. The lower spring surface 2738 is sealably connected to the contact housing 2765. A pressure reservoir 2740 is defined in the annulus between the contact housing 2765 and the spring assembly 2732. In one embodiment, the thrust plate is pressed against the backside of the substrate by the spring tension exerted by the spring bellow connector 2729. Application of the vacuum within the pressure chamber 2740 raises spring bellows connector 2729, and thereby also raises the thrust plate 66.

The thrust plate 66 is displaced to a raised position when a robot, not shown, is loading or unloading a substrate 22 onto the support element 1299. Following insertion by the robot, the substrate 22 rests upon the support element 1299 such that the periphery of the substrate 22 rests upon the support element 1299. The thrust plate 66 is then lowered firmly against the upper surface of the substrate 22 to apply a snug contact between the plating surface of the substrate 22 and the electric contact element 1079. Electricity applied to the seed layer on the substrate 22 is controlled by the controller 222.

The substrate holder assembly 2450 is configured to hold a substrate 22 in a secured position such that the substrate can be moved between the exchange, dry, and process positions. The thrust plate 66 can also be biased downwardly to secure a substrate 22 against the electric contact element 1067. The thrust plate 66 can be biased upward to create a vertically extending space between the thrust plate 66, and the support element 1299. This vertically-extending space is sufficiently high so a robot device can insert a substrate to be positioned on the contact element 1067. In the embodiment shown in FIG. 16, upward bias to the thrust plate is provided by a vacuum created within pressure reservoir 2740 by increasing the vacuum applied to the pressure reservoir by the controllable vacuum supply 2790. Increasing the vacuum in the pressure reservoir 2740 causes the upper spring surface 2728, other components of the spring assembly 2732, the attached thrust plate 66, and the electric contact elements 1067 to be displaced upwardly.

Reducing the vacuum from the controllable vacuum supply 2790 allows the spring bellow connector 2729 to return to its normal tensioned position by which the upper spring surface 2728 biases the attached thrust plate 66 into secure contact with a substrate 22 positioned on the support element 1299. This physical biasing of the substrate against the support element 1299 is sufficient to ensure electric contact between the electric contact element 1079 and the substrate 22. The downward bias of the thrust plate 66 against the substrate is sufficiently strong to limit relative rotation of the substrate relative to the thrust plate. A plurality of the electric contact elements 1079 are applied about the periphery of the substrate inserted in the substrate holder assembly and are electrically biased relative to the anode 16 to effect metal deposition on the seed layer. The thrust plate 66, the electric contact element 1067, the spring bellow connector 2729, and a substrate inserted on the electric contact element all rotate relative to the fluid shield 2720. The fluid shield 2720 remains fixed to the shaft shield 2763 and does not rotate.

The head rotation motor 2706 is mounted within, and at least partially extends through, the inner circumference of the hollow head rotation housing 2760 and is connected to the shaft 2470. The head rotation motor 2706 includes magnet 2777 and hollow coil segment 2775. The hollow coil segment 2775 is mounted to, and remains substantially stationary relative to, the inside of the hollow head rotation housing 2760. The magnet portion 2777 is attached to the shaft 2470 that can be rotated about a vertical axis. The magnet portion 2777 is physically disposed within the hollow portion of the hollow coil segment 2775. The hollow coil segment 2775 induces rotation in the magnet portion 2777 and the connected shaft 2470. Bearings 2785 are provided between shaft shield 2763 and the shaft 2470 to limit lateral travel of the shaft 2470 during rotation about a vertical axis. The output of the shaft 2470, at the lower end of the shaft, provides rotary motion to certain portions of the substrate holder assembly 2450 including a thrust plate 66 and a substrate 22 held between the thrust plate and the support element 1299, as described below. The head rotation motor 2706 may be of the type that produces output rotation in the range from, for example, 0 RPM to about 2500 RPM under the influence of the controller 222.

The fluid shield 2720 may be optionally disposed about the periphery of, and preferably spaced from, the substrate holder assembly 2450. The fluid shield 2770 contains electrolyte solution or other matter being spun from the substrate or substrate holder assembly by centrifugal rotation of the substrate holder assembly 2450 on other adjacent equipment.

As shown in FIG. 12, the process by which a metal film is deposited on the substrate seed layer involves, e.g., a copper sulfate electrolyte solution that contains copper sulfate molecules formed from positively charged copper ions and negatively charged sulfate ions. An electric current/voltage applied between the anode 16 to the substrate seed layer across the electrolyte solution causes the positively charged copper ions to be attracted to, and deposited on, the substrate plating surface 154. This deposition of the metal film will result in a depletion region forming around the substrate seed layer 154. The greater the negative charge applied to the seed layer, all other factors being identical, the greater the dimension of the depletion region 1278, the greater the electric current density applied to the substrate seed layer, and the greater the deposition rate of the metal film on the substrate seed layer.

The refreshed electrolyte solution that is supplied through electrolyte solution input port 1280 provides a generally upward flow of electrolyte solution within the electrolyte cell 12 that overflows at the annular weir 1282. This upward flow continues to supply refreshed electrolyte solution to the depletion region 1278, and thereby maintain the metal ion deposition process on the seed layer/plating surface.

When the substrate 22 is being inserted into or removed from the substrate holder assembly 2450, the vacuum contained in the pressure reservoir 2740 is reduced. The increase of the vacuum in the pressure reservoir 2740 and the action of spring 1332 displaces the thrust plate 66 upwardly as indicated in FIG. 16. The thrust plate 66 is spaced from the support element 1299 by a sufficient distance so a robot can position the substrate 22 between the thrust plate and the support element. After the substrate 22 is positioned on the support element 1299, the vacuum in the pressure reservoir 1340 is decreased so the spring bellow connector 2729 acts to displace the thrust plate 66 downwardly to retain the substrate 22 against the support element 1299. This retaining force provides an electric contact between the electric contact elements 1079 and the substrate 22 sufficient to provide an adequate current density in the substrate seed layer for normal electroplating operation. The electricity applied to the seed layer is applied via the electric conductor 2791 and the electric contact element 1079 under the control of the controller 222 shown in FIG. 12.

Multiple elements in the substrate holder assembly 2450 rotate substantially as a unit about a substantially vertical axis to provide rotation to the substrate 22. These rotating elements include the contact housing 2765, the upper spring surface 2728, the thrust plate 66, the electric contact elements 1079 the spring bellow connector 2729, the shaft 2470, and the support element 1299. Such rotation to the substrate may be performed when the substrate is immersed in the electrolyte solution during the plating process. Additionally, the substrate may be spun after it has been removed from the electrolyte solution to effect drying of the substrate by removing the electrolyte solution on the surface of the substrate by centrifugal force. The contact housing 2765 may be made from aluminum and can laterally translate and angularly rotate relative to the fluid shield 2720. The upper spring surface 2728 is rotatably coupled to the rotation shaft 2470. The shaft 2470 transmits angular rotation from the upper spring surface 2728 to the thrust plate 66.

Electric contact elements 1079 apply electricity to the seed layer on the substrate 22 either by direct contact with the seed layer, or by touching the diffusion barrier layer 1150 in a position closely spaced from the seed layer. The multiple electric contact elements 1079 touch the substrate at different radially spaced points around the periphery of the substrate. FIG. 14 shows two annular seals 1422a and 1422b that seal between the support element 1452 and the front, facing downward, of the substrate 22. The outer annular seal 1422b has a diameter greater than the diameter of the inner annular seal 1422a. Annular seals 1422a and 1422b seal in a similar manner as described above relative to the annular seals 1122a and 1122b shown in, and described relative to, FIG. 11. Though two angular seals 1422a and 1422b are shown in the embodiment in FIG. 12, it is envisioned that one, two, or any plural number of annular seals may be provided.

The combination of annular seals 1422a and 1422b limit the passage of electrolyte solution from within the electrolyte cell 12 to around to the edge and/or backside of the substrate. The seals 1422a and 1422b each contact the front of the substrate near the periphery of the substrate at a position that will not require metal ion deposition during substrate or chip production. The metal ion deposition on the edges or backside of the substrate since metal ions contained in the electrolyte solution will not flow past the annular seals 1422a and 1422b.

The electric contact element 1299 in the embodiment shown in FIG. 13 may contact the substrate in one of three alternative positions shown by electric contact elements 1479a, 1479b, or 1479c shown in FIG. 14. The electrical contact element 1479a is in contact with a diffusion barrier layer 1450 at a distance, shown by arrow d, from a backside plating surface 1424 on the substrate. As described in the description for the embodiment shown in FIG. 11, in the embodiment of positioning of electric contact elements shown in FIG. 14, the value of the distance d should preferably be decreased to under about 10 cm for where the electric current is being supplied to the electric contact elements by a DC power source, and some greater distance value where the electric current is provided to the electric contact elements by an RF power source. Additionally, the amount that either the seed layer or the diffusion barrier layer extends around the edge or backside of the substrate is related to the seed layer or diffusion barrier layer deposition process undergone by the substrate. The positioning of the electric contact elements relative to the seed layer and the diffusion barrier layer is configured to allow sufficient electric current flow from the electric contact elements to the seed layer on the front side of the substrate to provide the plating process. The value of the resistance of the diffusion barrier layer varies as a function of the distance d across the diffusion barrier layer that the electric contact element is separated from the seed layer, the depth of the barrier deposition layer, the depth of the seed layer, the dimensions of the substrate, the materials of the seed layer and the diffusion barrier layer, and other such considerations. The surface conduction of the diffusion barrier layer also enhances the electrical conductivity from the electric contact elements to the seed layer. The electric contact element 1479b contacts the backside plating surface portion 1424 of the substrate. The electric contact element 1479c is in contact with one of the bevel plating surface portion 1426 or the peripheral edge plating surface 1428 of the substrate. The electrical current density characteristics resulting from the use of each of the electric contact elements 1479a, 1479b, and 1479c is described below. The structure of electric contact elements shown and described in FIGS. 3–6 and 15 may be provided in the embodiment shown in FIG. 16. The electric contact elements 1479 are formed from a conductive material such as tantalum (Ta), titanium (Ti), platinum (Pt), gold (Au), copper (Cu), or silver (Ag). In one embodiment, the electric contact elements supply electricity to the backside or edge of the substrate. Conductors extend from the controller 222 through to the electric contact elements 1479a, 1479b, or 1479c mounted in the thrust plate.

During the metal film deposition process, a controllable electric charge is applied by the controller 222 that causes the seed layer formed on the substrate 22 to perform as a cathode. The controller 222 controls the level of the electric current/voltage applied relative to the electric contact element, the latter of which contact the seed layer 1215 deposited on the substrate or the diffusion barrier layer deposited adjacent the seed layer. The seed layer of the substrate 22 is electrically coupled to the anode 16 by the electrolyte solution. The seed layer attracts positive metal ions within the electrolyte solution, thus providing for metal film deposition.

One embodiment of the chemical reactions that occur in the embodiment of ECP system shown in FIG. 6 may be subdivided into whether a positive bias is applied between the anode and the seed layer to effect plating metal film on the substrate, or whether a negative bias is applied between the anode and the seed layer to effect deplating metal film on the substrate. If a sufficient positive bias is being applied so the voltage of the seed layer is below the voltage of the anode to effect plating on the substrate the following exemplary chemical reactions occur:

Anode chemical reaction $2H_2O \rightarrow O_2 + 4H^+ + 4e^-$ 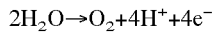

Cathode (seed layer) chemical reaction $Cu^{++} + 2e^- \rightarrow Cu$ 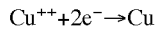

If a sufficient negative bias is applied so the voltage of the seed layer exceeds the voltage of the anode by a sufficient level to effect deplating copper from the seed layer, the following exemplary chemical reactions occur:

Anode chemical reaction $Cu \rightarrow Cu^{++} + 2e^-$ 

Cathode (seed layer) chemical reaction $Cu^{++} 2e^- \rightarrow Cu$ 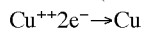

The controller 222 shown in the embodiment of FIG. 12 controls electric voltage and/or current supplied to both the anode 16 and the seed layer on the substrate/cathode 22. The controller 222 also controls the operation of the ECD system 1210. The controller 222 comprises a central processing unit (CPU) 260, a memory 262, a circuit portion 265, an input output interface (I/O) 264, and a bus, not shown. The controller 222 may be a general-purpose computer, a microprocessor, a microcontroller, or any other known suitable type of computer or controller. The CPU 260 performs the processing and arithmetic operations for the controller 222. The controller 222 controls the operation of the voltage applied to the anode 16, the plating surface 1215 on the substrate 22, and the operation of the substrate holder system 14.

The memory 262 includes random access memory (RAM) and read only memory (ROM) that together store the computer programs, operands, operators, dimensional values, system processing temperatures and configurations, and other parameters that control the electroplating operation. The bus, not shown, provides for digital information transmissions between CPU 260, circuit portion 265, memory 262, and I/O 264. The bus also connects I/O 264 to the portions of the ECD system 1210 that either receive digital information from, or transmit digital information to, controller 222.

I/O 264 provides an interface to control the transmissions of digital information between each of the components in controller 222. I/O 264 also provides an interface between the components of the controller 222 and different portions of the ECD system 1210. Circuit portion 265 comprises all of the other user interface devices, such as display and keyboard, system devices, and other accessories associated with the controller 222. While one embodiment of digital controller 222 is described herein, other digital controllers, analog controllers, or power supplies could function well in this application, and are within the intended scope of the invention.

3. Electric Interaction of the Substrates

In the embodiment of ECD system shown in FIGS. 10 and 11, neither the electric contact elements nor the substrate rotate about a substantially vertical axis. In the embodiment of ECD system shown in FIGS. 12, 13, 14, and 16, both the electric contact elements and the substrate rotate. As such, in both of the above embodiments of ECD systems, the electric contact element does not rotate relative to the substrate. The structural and electrical interaction between the electric contact elements and the substrate can be considered as similar in both embodiments. The following section provides an analysis of the current density across the seed layer on the substrate because of electrical voltage/current applied to the substrate.

Electric contact elements 1079a, 1079b, and 1079c in the embodiment shown in FIG. 11 can be applied at one or more different substrate backside or substrate edge locations as indicated. Electric contact elements 1479a, 1479b, and 1479c in the embodiment shown in FIG. 14 can be applied to the different substrate backside or edge locations as indicated. The point-of-contact between the seed layer and the electric contact elements are physically isolated from the electrolyte solution by seals, etc. that extend between the substrate 22 and the support element 1052, 1452. Since the support element 1052 or 1452 does not contain any electric contact elements, the seal between the substrate and the support element can be enhanced.

Both electric contact elements 1079b and 1079c in the embodiment shown in FIG. 11, and electric contact elements 1479b and 1479c in the embodiment shown in FIG. 14 are applied to the respective backsides or edges of the substrate. The seed layer locations that physically contact the electric contact elements are therefore separated by several millimeters from those seed layer locations that are exposed to electrolyte solution, and or in which metal ions are being deposited. This separation between the point where the electric contact element touches the seed layer and the electrolyte solution limits metal film deposition on the electric contact elements and enhances the uniformity of the current density produced by the electric contact elements.

Additionally, all of the electric contact elements 1079a, 1079b, or 1079c shown in the FIG. 11 embodiment are sealed from the electrolyte solution by seals 1122a, 1122b. Also, the electric contact elements 1479a, 1479b, and 1479c in the embodiment shown in FIG. 14 are sealed from the electrolyte solution by seals 1422a and 1422b. Since the electric contact elements do not contact the front side of the substrate, the seals contacting the front side of the substrate will not have to be designed to compensate for the surface contour irregularities provided by the electric contact elements. The seals 1422a, 1422b, 1022a, or 1022b will therefore be sealing against the flat surface of the substrate. Therefore, the sealing effectiveness of the seals shown in the embodiments of FIGS. 11 and 14 likely is greater than the sealing effectiveness in embodiments where the seals must seal against the surface irregularities of the electric contact elements. The electrolyte solution will therefore also not deposit metal film on the electric contact element, and therefore does not cause a bond of metal film to deposit between the electric contact elements and the substrate. Limiting access of the electrolyte solution to the electric contact elements, and the resultant bonds to the substrate, will alleviate problems when removing the substrate from the substrate holder assembly following processing.

The above embodiments describe electric contact elements 1079b and 1079c in the embodiment as shown in FIG. 11, as well as 1479b and 1479c in the embodiment shown in FIG. 14, which contact the seed layer directly. However, electric contact element 1079a in the embodiment shown in FIG. 11, and 1479a in the embodiment shown in FIG. 14, contact the respective diffusion barrier layers 1150 and 1450 at a respective distance d, and d2, from the seed layer. The electric resistance of the diffusion barrier layer is higher than the resistance of the seed layer. However, the electric resistance of the diffusion barrier layer is sufficient to conduct electric current from the electric contact element to the seed layer. This diffusion barrier layer distance that the seed layer is separated from the electric contact element is selected to be small enough so the electrical current will not be diminished substantially by the resistance of the diffusion barrier layer material itself. The electrical current from the electric contacts will therefore be able to flow adequately via the diffusion barrier layer to the seed layer. The distance d in the embodiment shown in FIG. 11, and the distance d2 in the embodiment shown in FIG. 14, that represents the length of diffusion barrier layer that electric current flows across from the electric contact element to the seed layer is selected to ensure that adequate current density is applied to the seed layer 154. If the distances d or d2 are too great, the resistance of the diffusion barrier layer will limit the electric current flowing to the seed layer, and the resultant electric current density generated across the seed layer. The distance shown by arrow d, and d2, may vary and be selected depending upon the materials in the diffusion barrier layer, the dimensions of the substrate, the materials and dimensions of substrate depositions, and the voltages/currents applied through the electric contact elements.

Positioning the physical point-of-contact between the seed layer, or the diffusion barrier layer, and the electric contact elements from the portion of the seed layer coating the front side to the portion of the seed layer coating the backside, or the edge, of the substrate increases the distance between the point-of-contact and processed portions of the seed layer. This increase in distance from a seed layer location to the point-of-contact also results in less variation of electric current density for a given change in distance and direction along the seed layer. For example, if the point-of-contact with the seed layer is on the front side of the substrate, then a half-inch displacement within the surface of the seed layer could change the seed layer location from being adjacent the electric contact element to being spaced half an inch from the electric contact element. If the point-of-contact is instead on the backside of the substrate, then the distance around the edge of the substrate and the backside of the substrate to the physical contact between the electric contact element and the seed layer is added to the total distance from the seed layer location to the physical contact. Assume that the distance along the seed layer around the periphery of the substrate is an inch. The same half-inch displacement along the seed layer as described above has to be added to the distance around the periphery of substrate. The half-inch displacement therefore could results in a maximum change in the distance between the nearest substrate seed layer location to the point-of-contact of the electric contact element from half an inch to an inch and a half. The relationship between electric current density at a seed layer location compared to the distance in the seed layer to the electric contact element is nonlinear. Therefore the percentage change in current density in the seed layer between when the distance within the distance to the point-of-contact along the seed layer is changed from one inch to an inch and a half is smaller compared to when the same distance is changed from zero inches to half an inch. Therefore, the uniformity of the current density within the seed layer locations is enhanced by increasing the distance between the nearest substrate seed layer position to the electric contact element to the electrical contact element. One embodiment that increases the distance to the junction of the seed layer and the electric contact element is provided by moving the contact point of the electric contact element at the edge or the backside of the substrate.

While the foregoing is directed to the preferred embodiment of the present invention, other and further embodiments of the invention may be devised without departing from the basic scope thereof.

What is claimed is:

1. An apparatus for depositing a metal film onto a substrate having a seed layer disposed on at least a front side and an edge, the apparatus comprising:
    a substrate holder system configured to position the substrate wherein at least a portion of the seed layer disposed on the front side of the substrate is in contact with an electrolyte solution; and
    one or more electric contact elements configured to contact the seed layer disposed on a bevel plating surface on the edge of the substrate.

2. The apparatus of claim 1, further comprising a seal disposed between the front side of the substrate and the substrate holder system.

3. The apparatus of claim 2, wherein the seal is configured to limit the electrolyte solution from contacting the back side of the substrate.

4. The apparatus of claim 2, wherein the seal comprises at least two annular seals spaced apart from each other.

5. The apparatus of claim 2, wherein the seal is circumferentially disposed between the first side of the substrate and the substrate holder system.

6. The apparatus of claim 2, further comprising a second seal circumferentially disposed around the first seal.

7. The apparatus of claim 1, wherein a diffusion barrier layer is disposed between the seed layer and the substrate.

8. The apparatus of claim 1, wherein at least a portion of the one or more contact elements is configured to contact a diffusion barrier layer disposed on the back side of the substrate.

9. The apparatus of claim 1, wherein the electric contact elements are disposed through the substrate holder system.

10. An apparatus for depositing a metal film onto a substrate, comprising:
   a substrate holder system configured to support the substrate such that the metal film is deposited on a first side of the substrate;
   an electric contact element configured to contact at least one of the second side or the edge of the substrate; and
   a seal disposed between the substrate holder system and the first side of the substrate.

11. The apparatus of claim 10, wherein the seal limits passage of fluid between the electrolyte cell and the second side of the substrate.

12. The apparatus of claim 10, wherein the seal comprises at least two peripherally circumferentially spaced seals.

13. The apparatus of claim 10, further comprising a rotatable head assembly disposed to rotate the substrate.

14. The apparatus of claim 10, wherein the substrate is not rotated about its vertical axis when the substrate is immersed in the electrolyte solution.

15. An apparatus for depositing a metal film onto a substrate having a seed layer on at least a first side, a second side that is opposed to the first side, and an edge, the apparatus comprising:
   a substrate holder system disposed to support the substrate at a position wherein at least a portion of the seed layer on the substrate is disposed, in contact with an electrolyte solution; and
   an electric contact element disposed to contact one or more of the second side or the edge of the substrate, wherein the electric contact element contacts a diffusion barrier layer disposed on the second side of the substrate.

16. An apparatus for depositing a metal film onto a substrate having seed layer on at least a first side, a second side that is opposed to the first side, and an edge, the apparatus comprising:
   a substrate holder system disposed to support the substrate at a position wherein at least a portion of the seed layer on the substrate is disposed in contact with an electrolyte solution; and
   an electric contact element disposed to contact one or more of the second side or the edge of the substrate, wherein the electric contact element is disposed to contact a bevel plating surface on the edge of the substrate.

17. A method for depositing a metal film onto a substrate having a seed layer disposed thereon, comprising:
   positioning the substrate in a substrate holder system such that the seed layer disposed on a front side of the substrate is in contact with an electrolyte solution;
   contacting the seed layer disposed on at least a portion of a back side of the substrate with one or more electric contact elements; and
   limiting the electrolyte solution from contacting the back side of the substrate using a seal disposed between the front side and the substrate holder system.

18. The method of claim 17, wherein the seed layer disposed on the front side is in communication with the seed layer disposed on the back side of the substrate.

19. The apparatus of claim 17, wherein the contacting step comprises contacting a diffusion barrier layer disposed on the back side of the substrate with at least a portion of the one or more contact elements.

20. A method for depositing a metal film onto a substrate having a metal film onto a first side, wherein the substrate comprises a second side that is opposed the first side and an edge, the method comprising:
   supporting the substrate in a seed layer facing down position at a position wherein at least a portion on the seed layer of the first side of the substrate is disposed in contact with an electrolyte solution; and
   contacting the second side or the edge of the substrate with an electric contact element, wherein the electric contact element contacts a diffusion barrier layer on the second side of the substrate, wherein the portion of the diffusion barrier layer that the electric contact element contacts is electrically coupled to the seed layer.

21. A method for depositing a metal film on a first side of a substrate having the first side, a second side and an edge, wherein the first side is opposed to the second side, the method comprising:
   supporting the substrate in a seed layer facing down position at a position wherein at least a portion on the seed layer of the first side of the substrate is disposed in contact with an electrolyte solution; and
   contacting the second side or a bevel plating surface on the edge of the substrate with an electric contact element.

22. A method for depositing a metal film on a first side of a substrate having the first side, a second side and an edge, wherein the first side is opposed to the second side, the method comprising:
   supporting the substrate in a seed layer facing down position at a position wherein at least a portion on the seed layer of the first side of the substrate is disposed in contact with an electrolyte solution; and
   contacting the second side or a peripheral edge plating surface on the edge of the substrate with an electric contact element.

23. A method for depositing a metal film onto a substrate having a metal film onto a first side, wherein the substrate comprises a second side that is opposed the first side and an edge, the method comprising:
   supporting the substrate in a seed layer facing down position at a position wherein at least a portion on the seed layer of the first side of the substrate is disposed in contact with an electrolyte solution;
   contacting the second side or the edge of the substrate with an electric contact element; and
   rotating the substrate about the vertical axis of the substrate.

24. An apparatus for deposition a metal film on at least a first side of a substrate having a seed layer, the substrate having a second side that is opposed the first side and an edge, the apparatus comprising:
   a substrate holder system disposed to support the substrate at a position wherein at least a portion of the seed layer on the substrate is disposed in contact with an electrolyte solution, the substrate holder system comprising:
      a substrate holder assembly that supports the substrate;
      a head rotation portion that provides rotation to the substrate holder assembly; and
      a head lift portion that can vertically displace the substrate holder assembly; and an electric contact element contained in the substrate holder assembly, the electric contact element being disposed to contact one or more of the second side or the edge of the substrate.

25. The apparatus of claim 24, further comprising a seal disposed between the substrate holder system and the first side of the substrate.

26. The apparatus of claim 24, wherein the seal is configured to minimize the electrolyte solution from contacting the electric contact element.

27. The apparatus of claim 26, wherein the seal comprises at least two annular seals spaced apart from each other.

28. An apparatus for depositing a metal film onto a substrate having a seed layer disposed thereon, comprising:
- means for positioning the substrate such that the seed layer disposed on a front side of the substrate is in contact with an electrolyte solution;
- means for electrically contacting the seed layer disposed on at least a portion of a back side of the substrate; and
- means for limiting the electrolyte solution from contacting the back side of the substrate.

29. The apparatus of claim 28, further comprising rotation means for controllably rotating the substrate.

30. The apparatus of claim 28, wherein the limiting means is disposed between the front side of the substrate and the positioning means.

31. The apparatus of claim 28, further comprising means for electrically contacting a diffusion barrier layer disposed on the back side of the substrate.

32. A computer readable medium containing a computer instruction routine that, when executed, causes a general purpose processor to deposit a metal film on a seed layer disposed on at least a front side of a substrate, the routine comprising:
- positioning the substrate in a substrate holder system such that the seed layer disposed on a front side of the substrate is in contact with an electrolyte solution;
- contacting the seed layer disposed on at least a portion of a back side of the substrate with an electric contact element; and
- limiting the electrolyte solution from contacting the back side of the substrate using a seal disposed between the front side and the substrate holder system.

33. An apparatus for depositing a metal film onto a substrate, comprising:
- a substrate holder system having a substrate-receiving portion configured to receive a front side of the substrate;
- one or more electric contact elements configured to electrically contact a back side of the substrate; and
- a seal disposed on the substrate-receiving portion.

34. The apparatus of claim 33, wherein the substrate holder system is configured to position the substrate such that the front side of the substrate is in contact with an electrolyte solution, and wherein the seal is configured to prevent the electrolyte solution from contacting the contact elements.

35. The apparatus of claim 33, wherein the contact elements are disposed through the substrate holder system.

36. An apparatus for depositing a metal film on a front side of a substrate having a seed layer disposed thereon, comprising:
- a substrate holder system configured to position the substrate such that at least a portion of the front side of the substrate is in contact with an electrolyte solution, the substrate holder system comprising:
  - a substrate holder assembly that supports the substrate;
  - a head rotation portion that provides rotation to the substrate holder assembly; and
  - a head lift portion configured to vertically displace the substrate holder assembly; and
- one or more electric contact elements disposed through the substrate holder assembly, the electric contact elements being configured to contact at least a portion of a back side of the substrate.

37. A method for depositing a metal film onto a substrate having a seed layer disposed thereon, comprising:
- positioning the substrate in a substrate holder system such that the seed layer disposed on a front side of the substrate is in contact with an electrolyte solution; and
- contacting a bevel plating surface on an edge of the substrate with one or more electric contact elements.

38. A method for depositing a metal film onto a substrate having a seed layer disposed thereon, comprising:
- positioning the substrate in a substrate holder system such that the seed layer disposed on a front side of the substrate is in contact with an electrolyte solution; and
- contacting a peripheral edge plating surface on an edge of the substrate with one or more electric contact elements.

* * * * *